(12) United States Patent
Park et al.

(10) Patent No.: US 11,227,890 B2
(45) Date of Patent: Jan. 18, 2022

(54) LIGHT-EMITTING DEVICES INCLUDING DRIVING DEVICES, METHODS OF MANUFACTURING THE SAME, AND DISPLAY DEVICES INCLUDING LIGHT EMITTING DEVICE

(71) Applicant: Samsung Electronics Co., Ltd., Suwon-si (KR)

(72) Inventors: Younghwan Park, Seongnam-si (KR); Jongseob Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/885,936

(22) Filed: May 28, 2020

(65) Prior Publication Data

US 2021/0118942 A1 Apr. 22, 2021

(30) Foreign Application Priority Data

Oct. 17, 2019 (KR) ........................ 10-2019-0129341

(51) Int. Cl.
*H01L 27/15* (2006.01)
(52) U.S. Cl.
CPC .................................. *H01L 27/15* (2013.01)
(58) Field of Classification Search
CPC ....... H01L 27/15; H01L 33/38; H01L 33/145; H01L 33/08; H01L 27/1214; H01L 33/06; H01L 33/0075; H01L 33/0008
See application file for complete search history.

(56) References Cited

U.S. PATENT DOCUMENTS

| | | | |
|---|---|---|---|
| 8,110,835 B2 | 2/2012 | Kumar et al. |
| 8,716,748 B2 | 5/2014 | Imada et al. |
| 9,054,232 B2 | 6/2015 | Chung |
| 9,151,711 B2 | 10/2015 | Cho et al. |
| 9,153,732 B2 | 10/2015 | Oraw |

(Continued)

FOREIGN PATENT DOCUMENTS

JP 5789967 B2 10/2015

OTHER PUBLICATIONS

Lee, Ya-Ju et al., "Monolithic integration of GaN-based light-emitting diodes and metal-oxide-semiconductor field-effect transistors", Optics Express, vol. 22, No. S6, DOI: 10.1364/OE.22.0A1589, Oct. 20, 2014, p. A1589-A1595.

(Continued)

*Primary Examiner* — Robert G Bachner
(74) *Attorney, Agent, or Firm* — Harness, Dickey & Pierce, P.L.C.

(57) ABSTRACT

A light-emitting device includes a first electrode layer; a second electrode layer; a third electrode layer separated from the first and second electrode layers; a multi-quantum well (MQW) layer between the first electrode layer and the second and third electrode layers; a first material layer between the first electrode layer and the MQW layer and doped with a first conductive type dopant; a second material layer between the second and third electrode layers and the MQW layer and doped with a second conductive type dopant; a gate insulating layer between the third electrode layer and the second material layer; and a current blocking layer configured to at least partially block a flow of a current between the second electrode layer and the MQW layer.

43 Claims, 41 Drawing Sheets

(56) References Cited

U.S. PATENT DOCUMENTS 10,201,051 B1 2/2019 Blanchard

OTHER PUBLICATIONS

Li, Z. et al., "Monolithic integration of light-emitting diodes and power metal-oxide-semiconductor channel high-electron-mobility transistors for light-emitting power integrated circuits in GaN on sapphire substrate", Applied Physics Letters, vol. 102, No. 19, p. 192107, http://dx.doi.org/10.1063/1.4807125, May 16, 2013.

LIGHT-EMITTING DEVICES INCLUDING DRIVING DEVICES, METHODS OF MANUFACTURING THE SAME, AND DISPLAY DEVICES INCLUDING LIGHT EMITTING DEVICE

CROSS-REFERENCE TO RELATED APPLICATION

This application claims the benefit of Korean Patent Application No. 10-2019-0129341, filed on Oct. 17, 2019, in the Korean Intellectual Property Office, the disclosure of which is incorporated herein in its entirety by reference.

BACKGROUND

1. Field

The present disclosure relates to light-emitting devices and methods of manufacturing the same, and more particularly, to light-emitting devices including driving devices, methods of manufacturing the same, and display devices including the light-emitting device.

2. Description of Related Art

Among light-emitting devices, light-emitting diodes (LEDs), which are light-emitting devices utilizing gallium indium nitride semiconductors, may be used as lighting or a backlight source of a display. Recently, research has been actively conducted for using LEDs as a light source of a display by forming the LEDs to a pixel size.

In order to drive LEDs through active-matrix driving, a driving circuit including two or more transistors and capacitors is used for each pixel. Accordingly, research has been conducted to realize a display by bonding the driving circuit and the LED pixel to each other after manufacturing the driving circuit on a silicon substrate.

SUMMARY

Provided are light-emitting devices configured to increase the degree of integration of a device and simplifying the configuration of related elements.

Provided are methods of manufacturing the light-emitting devices.

Provided are display devices including the light-emitting devices.

Additional aspects will be set forth in part in the description which follows and, in part, will be apparent from the description, or may be learned by practice of the presented example embodiments of the disclosure.

According to some example embodiments, a light-emitting device includes: a first electrode layer; a second electrode layer; a third electrode layer isolated from direct contact with the first and second electrode layers; a multi-quantum well (MQW) layer between the first electrode layer and the second and third electrode layers; a first material layer between the first electrode layer and the MQW layer, the first material layer doped with a first conductive type dopant; a second material layer between the second and third electrode layers and the MQW layer, the second material layer doped with a second conductive type dopant; a gate insulating layer between the third electrode layer and the second material layer; and a current blocking layer configured to at least partially (e.g., partially or completely) block a flow of a current between the second electrode layer and the MQW layer.

A capacitor may be between the second electrode and the third electrode. The capacitor may include a portion of the second electrode layer, a portion of the third electrode layer, and a portion of the gate insulating layer. A portion of the second electrode layer, a portion of the third electrode layer, and a portion of the gate insulating layer may be sequentially stacked.

The first material layer may include a sequential stack of a p-type material layer and a p+-type material layer, and the second material layer may include a sequential stack of an n-type material layer and an n+-type material layer.

The current blocking layer may include an oxide layer or a nitride layer. The first and second material layers may include compound semiconductor layers. The current blocking layer may be between the n-type material layer and the n+-type material layer.

A side surface of the third electrode layer may face side surfaces of the n+-type material layer and the current blocking layer and the gate insulating layer may be between the side surface of the third electrode layer and the side surfaces of the n+-type material layer and the current blocking layer. The second electrode layer may cover a side surface of the n+-type material layer and a plane adjacent to the side surface.

The first electrode layer may be connected to a functional layer. The third electrode layer may be connected to a functional layer that includes a switching transistor. The third electrode layer may be a gate electrode of a driving transistor, and a capacitor may be connected between the gate electrode of the driving transistor and the ground terminal.

According to some example embodiments, a light-emitting device includes: a first electrode; a second electrode; a multi-quantum well (MQW) layer between the first and second electrodes; a p-type material layer between the first electrode and the MQW layer; an n-type material layer between the second electrode and the MQW layer; a blocking layer configured to at least partially (e.g., partially or completely) block a flow of a carrier supplied to the MQW layer; and a third electrode configured to form a channel through which the carrier flows in the blocking layer in response to an operating voltage being applied to the light-emitting device.

In the light-emitting device, a capacitor may be between the second electrode and the third electrode. An insulating layer may be between the third electrode, the blocking layer, and the n-type material layer. The first electrode may be connected to the functional layer. The third electrode may be connected to a functional layer that includes a switching transistor. The capacitor may include a portion of the second electrode, a portion of the third electrode, and a portion of the insulating layer. At this point, a portion of the second electrode, a portion of the third electrode, and a portion of the insulating layer may be sequentially stacked. The third electrode may be a gate electrode of a driving transistor, and a capacitor may between the gate electrode of the driving transistor and a ground terminal.

According to some example embodiments, a display device includes: a first panel comprising at least a transistor; a light-emitting device provided on the first panel; and a second panel parallel to the first panel and covering the light emitting device, wherein the light emitting device is the light emitting device described above. In an example, layers included in the light-emitting device may be sequentially stacked on the first panel toward the second panel. In another example, the first panel, the light-emitting device, and the second panel may be arranged so that light emitted from one of the sides of the MQW layer is emitted through the second panel.

According to an aspect of some example embodiments, a method of manufacturing a light-emitting device, the method includes: forming a buffer layer on a substrate; sequentially forming, on the buffer layer, a first material layer doped with a first conductive type dopant, an MQW layer, a second material layer doped with a second conductive type dopant, and an upper electrode layer; removing the substrate and the buffer layer; forming a lower electrode layer on an exposed surface of the first material layer exposed based on removal of the substrate and the buffer layer; and forming a blocking layer that is configured to at least partially (e.g., partially or completely) block a flow of a carrier supplied to the MQW layer, wherein one of the forming of the upper electrode layer or the forming of the lower electrode layer includes forming a gate electrode and a cathode isolated from direct contact with each other, and the gate electrode is formed so as not to contact a material layer formed between the MQW layer and the gate electrode.

According to some example embodiments, the blocking layer may be formed between the upper electrode layer and the MQW layer.

According to some example embodiments, the blocking layer may be formed between the lower electrode layer and the MQW layer.

The first conductive type dopant may include a p-type dopant, and the second conductive type dopant may include an n-type dopant, and the forming of the upper electrode layer may include forming the gate electrode and forming the cathode.

The first conductive type dopant may include an n-type dopant, and the second conductive type dopant may include a p-type dopant, and the forming of the lower electrode layer may include forming the gate electrode and forming the cathode.

The method may further include forming an insulating layer between the material layer and the gate electrode.

The forming of the first material layer may include: sequentially forming an n+-type material layer and an n-type material layer or sequentially forming a p+-type material layer and a p-type material layer.

The forming of the second material layer may include: sequentially forming an n+-type material layer and an n-type material layer or sequentially forming a p+-type material layer and a p-type material layer.

The blocking layer may include a layer configured to block a flow of current to the MQW layer, and the blocking layer is formed as a p-type material layer.

A first functional layer may be formed on one of the upper electrode layer or the lower electrode layer, and a second functional layer may be formed on another one of the upper electrode layer or the lower electrode layer.

A portion of the second material layer may be formed between the blocking layer and the MQW layer, and the other portion thereof may be formed between the blocking layer and the upper electrode layer.

A portion of the first material layer may be formed between the blocking layer and the MQW layer, and the other portion thereof may be formed between the blocking layer and the lower electrode layer.

According to some example embodiments, an insulating layer may be formed between the gate electrode and the second material layer.

According to some example embodiments, an insulating layer is formed between the gate electrode and the first material layer.

The gate electrode, the cathode, and the insulating layer may be formed so that a capacitor is formed between the gate electrode and the cathode. The capacitor may be formed based on sequentially stacking a portion of the gate electrode, a portion of the insulating layer, and a portion of the cathode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
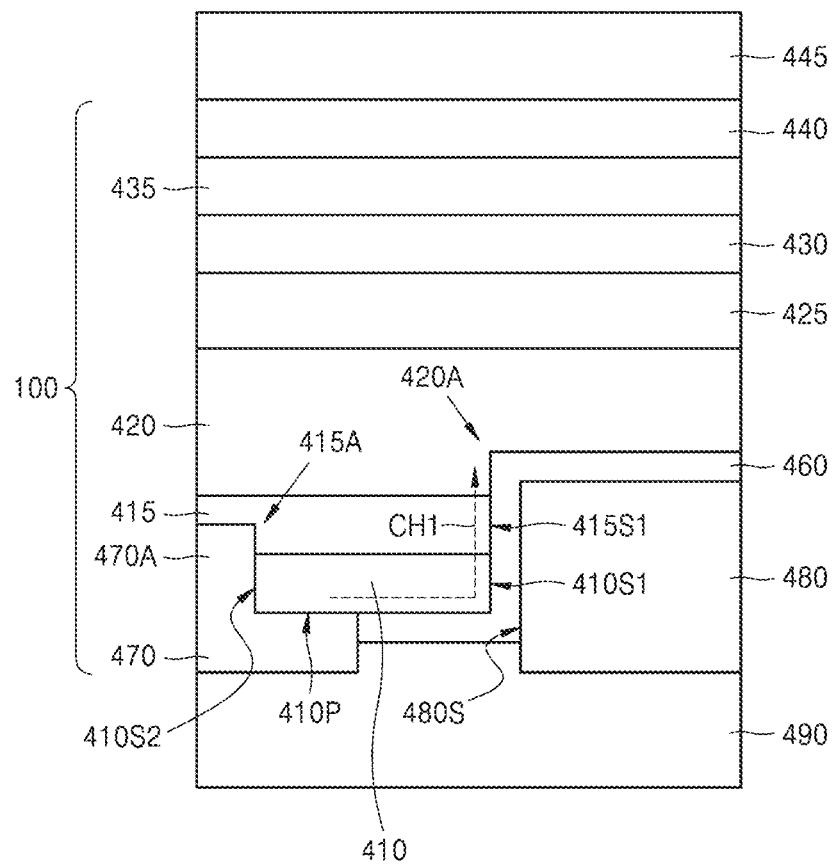
FIG. 1 is a cross-sectional view of a light-emitting device according to some example embodiments.

Reference will now be made in detail to example embodiments, some of which are illustrated in the accompanying drawings, wherein like reference numerals refer to like elements throughout. In this regard, the present embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a light-emitting device including a driving device and a method of manufacturing the same according to some example embodiments will be described in detail with reference to the accompanying drawings. In the drawings, thicknesses of layers and regions may be exaggerated for clarity of layers and regions. The following example embodiments described below are merely illustrative, and various modifications may be possible from some example embodiments of the present disclosure. In the layer structures described below, when an element or layer is referred to as being "on" or "above" another element or layer, the element or layer may be directly on another element or layer or intervening elements or layers.

FIG. 1 shows a first light-emitting device 100 (hereinafter, referred to as a first light-emitting device 100) including a driving device according to some example embodiments.

Referring to FIG. 1, the first light-emitting device 100 may include a first electrode layer 440, a second electrode layer 470, and a third electrode layer 480 separated from each other (e.g., isolated from direct contact with each other). In some example embodiments, the first electrode layer 440 may be described as an upper electrode layer and the second and third electrode layers 470 and 480 may be described, individually or collectively, as a lower electrode layer. In some example embodiments, the first electrode layer 440 may be described as a lower electrode layer and the second and third electrode layers 470 and 480 may be described, individually or collectively, as an upper electrode layer. The first electrode layer 440 may be, for example, an anode layer or may include an anode layer. The second electrode layer 470 may be a cathode layer or include a cathode layer. The third electrode layer 480 may be, for example, a gate electrode layer or may include a gate electrode layer. The first electrode layer 440 is separated from the second and third electrode layers 470 and 480 in a vertical direction. That is, the first electrode layer 440 and the second and third electrode layers 470 and 480 are separated from each other in a direction parallel to a light emission direction of the first light-emitting device 100. Light generated from the first light-emitting device 100 may be emitted through the first electrode layer 440. The first electrode layer 440 may include a material layer that has conductivity and is transparent to light. The second and third electrode layers 470 and 480 are horizontally separated from each other. An insulating layer 460 is provided between the second electrode layer 470 and the third electrode layer 480. The insulating layer 460 may be used as, and may be referred to as, a gate insulating layer. A portion of the insulating layer 460 is between the second electrode layer 470 and the third electrode layer 480. Accordingly, the second and third electrode layers 470 and 480 and the insulating layer 460 may form a capacitor or have the same effect as forming a capacitor. As a result, an effect equivalent to the presence of a capacitor between the second electrode layer 470 and the third electrode layer 480 may be obtained.

Figure 2:
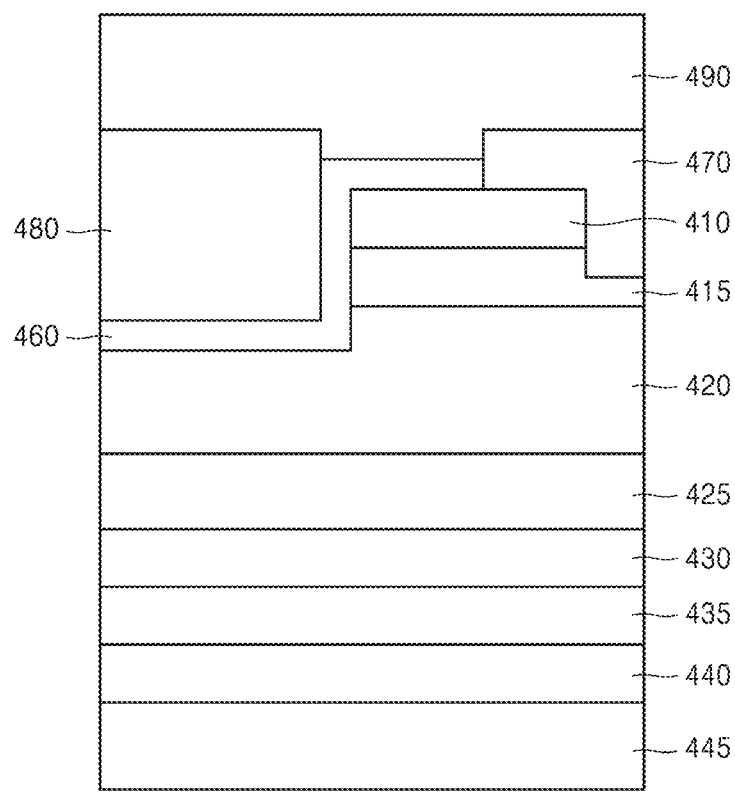
FIG. 2 is a cross-sectional view of reversed up and down of the light-emitting device of FIG. 1.

The first light-emitting device 100 may include an active layer that generates light. The first light-emitting device 100 may include a multi-quantum well (MQW) layer 425 as an example of the active layer. As shown in FIG. 1, the MQW layer 425 is provided between the first electrode layer 440 and the second and third electrode layers 470 and 480. That is, the MQW layer 425 is disposed on the second and third electrode layers 470 and 480, and the first electrode layer 440 is disposed on the MQW layer 425. This arrangement may be reversed as shown in FIG. 2. The MQW layer 425 may include a material layer that emits light of a specific wavelength (for example, blue light). In another example, the MQW layer 425 may be a material layer that emits white light or include the material layer. First and second material layers 430 and 435 doped with a p-type conductivity dopant (e.g., a first conductive type dopant) may be between the first electrode layer 440 and the MQW layer 425. The first material layer 430 may be in direct contact with the MQW layer 425. The second material layer 435 disposed between the first electrode layer 440 and the first material layer 430 may be a material layer for contacting the first electrode layer 440. The degree of doping (for example, doping concentration) of the first and second material layers 430 and 435 may be the same or different from each other. For example, the doping concentration of the second material layer 435 may be greater than the doping concentration of the first material layer 430. The first material layer 430 may be a p-type compound semiconductor layer (e.g., p-type material layer). For example, the first material layer 430 may be a p-type nitride semiconductor layer. The p-type nitride semiconductor layer may be a nitride semiconductor layer doped with a p-type dopant and may be, for example, a GaN layer, an AlGaN layer, or an InGaN layer, but is not limited thereto. The second material layer 435 may be a p+-type compound semiconductor layer (e.g., p+-type material layer). For example, the second material layer 435 may be a p+-type nitride semiconductor layer. As described herein, the first and second material layers 430 and 435 may be collectively referred to as a first material layer or a second material layer, and such a first (or second) material layer may be described to include a sequential stack of a p-type material layer (first material layer 430) and a p+-type material layer (second material layer 435). Here, the nitride semiconductor layer may be a GaN layer, an AlGaN layer or an InGaN layer, but is not limited thereto. In one example, except that the doping concentrations are different from each other, the first and second material layers 430 and 435 may be the same compound semiconductor layer from each other. Although not shown in the drawings, another material layer may further be provided between the first electrode layer 440 and the MQW layer 425 in addition to the first and second material layers 430 and 435. In this case, the another material layer may also be a doped semiconductor layer or a doped compound semiconductor layer.

Next, third and fourth material layers 410 and 420 and a current blocking layer 415 are between the MQW layer 425 and the second and third electrode layers 470 and 480. The third material layer 410 and the fourth material layer 420 are separated from each other. The current blocking layer 415 is disposed between the third material layer 410 and the fourth material layer 420. The current blocking layer 415 is configured to reduce or prevent a flow of a carrier (e.g., a current) from the second electrode layer 470 to the fourth material layer 420. As described herein, the current blocking layer 415 may be configured to at least partially (e.g., partially or completely) block a flow of a carrier (e.g., a current) to the MQW layer 425, for example a flow of a carrier (e.g., current) between the second electrode layer 470 and the MQW layer 425. The third material layer 410, the current blocking layer 415, and the fourth material layer 420 are sequentially stacked and contacted with each other from the second electrode layer 470 to the MQW layer 425. The fourth material layer 420 is provided between the MQW layer 425 and the current blocking layer 415. The fourth material layer 420 and the MQW layer 425 may be in direct contact with each other. The third material layer 410 is in direct contact with the second electrode layer 470. The second electrode layer 470 may cover a portion of a lower surface of the third material layer 410. The second electrode layer 470 covers the left side of the third material layer 410 and extends upward by a given length. An upwardly extending portion 470A of the second electrode layer 470 is in contact with the current blocking layer 415. An end of the upwardly extending portion 470A of the second electrode layer 470 is at a higher position than the third material layer 410 and is between upper and lower surfaces of the current blocking layer 415. The upwardly extending portion 470A of the second electrode layer 470 is provided not to penetrate through the current blocking layer 415. The upper surface of the current blocking layer 415 that is in contact with a lower surface of the fourth material layer 420 is flat. The lower surface of the current blocking layer 415 is not flat and includes a step difference 415A. A thickness of the current blocking layer 415 at a left portion of the step difference 415A is less than that of a right portion of the step difference 415A. The upper end of the upwardly extending portion 470A of the second electrode layer 470 is in contact with the step difference 415A. A side surface of the step difference 415A and an entire lower surface of the thinner portion of the current blocking layer 415 are in contact with the upwardly extending portion 470A of the second electrode layer 470. The insulating layer 460 is formed between the second electrode layer 470 and the third electrode layer 480. One end, that is, a left end of the insulating layer 460, is in direct contact with the second electrode layer 470. A right portion of the insulating layer 460 may be in contact with the third electrode layer 480. A portion of a lower surface of the third material layer 410 is in contact with the second electrode layer 470, and the remainder of the lower surface is covered by the insulating layer 460. The remainder of the lower surface of the third material layer 410 is in direct contact with the insulating layer 460. The third electrode layer 480 faces right sides of the third material layer 410 and the current blocking layer 415 on the right sides of the third material layer 410 and the current blocking layer 415. The third electrode layer 480, the third material layer 410, and the current blocking layer 415 are separated from each other. The insulating layer 460 extends between the third electrode layer 480 and a stack of the third material layer 410 and the current blocking layer 415, and extends on an upper surface of the third electrode layer 480. The right side surfaces of the third material layer 410 and the current blocking layer 415 may be covered by the insulating layer 460 and may be in directly contact with the insulating layer 460. The insulating layer 460 may cover most of a left side of the third electrode layer 480 and may be in direct contact with the left side of the third electrode layer 480. Among the left side surface of the third electrode layer 480, a portion that directly faces the right side surfaces of the third material layer 410 and the current blocking layer 415 may be at least covered by the insulating layer 460. Due to the insulating layer 460, the third electrode layer 480 is prevented from directly contacting the third material layer 410, the current blocking layer 415, and the fourth material layer 420. A whole upper surface of the fourth material layer 420 that is in contact with the lower surface of the MQW layer 425 is flat. A lower surface of the fourth material layer 420 includes a step difference 420A. A thickness of a left side of the step difference 420A of the fourth material layer 420 is greater than that of a right side of the step difference 420A. The third material layer 410 and the current blocking layer 415 are below a left portion of the step difference 420A of the fourth material layer 420. The second electrode layer 470 is also disposed below the left portion of the step difference 420A of the fourth material layer 420. The third electrode layer 480 is provided under a right portion of the step difference 420A of the fourth material layer 420. In the case of the insulating layer 460, a portion of the insulating layer 460 is formed under the left portion of the step difference 420A of the fourth material layer 420, and the other portion is formed under the right portion of the step difference 420A. The insulating layer 460 covers a side surface of the step difference 420A of the fourth material layer 420, and continuously a lower surface of the thin portion, that is, the right side of the step difference 420A of the fourth material layer 420. As a result, the insulating layer 460 reduces or prevents the third electrode layer 480 from contacting the right side of the step difference 420A of the fourth material layer 420 by extending between the third electrode layer 480 and the step difference 420A of the fourth material layer 420. The insulating layer 460 may be a single layer or a multilayer. The third material layer 410 and the fourth material layer 420 may be compound semiconductor layers doped with an n-type conductivity dopant (e.g., a second conductive type dopant). As an example, the third and fourth material layers 410 and 420 may be nitride semiconductor layers doped with an n-type conductivity dopant. The doping concentrations of the third and fourth material layers 410 and 420 may be the same or different from each other. As an example, the doping concentration of the third material layer 410 may be greater than that of the fourth material layer 420. In one example, the third material layer 410 may be an n+-type nitride semiconductor layer (e.g., n+-type material layer), and the fourth material layer 420 may be an n-type nitride semiconductor layer (e.g., n-type material layer). As described herein, the third and fourth material layers 410 and 420 may be collectively referred to as a second material layer or a first material layer, and such a second (or first) material layer may be described to include a sequential stack of a n-type material layer (fourth material layer 420) and a n+-type material layer (third material layer 410). As shown in FIG. 1, the current blocking layer 415 may be between a fourth material layer 420 that is an n-type material layer and a third material layer 410 that is an n+-type material layer. As shown in FIG. 1, a side surface 480S of the third electrode layer 480 may face side surface 410S1 of the third material layer 410, which may be an n+-type material layer, and side surface 415S1 of the current blocking layer 415, where the first insulating layer 460 may be between side surface 480S of the third electrode layer 480 and side surfaces 410S1 and 415S1 of the third material layer 410 and current blocking layer 415. As further shown in FIG. 1, the second electrode layer 470 may cover a side surface 410S2 of the third material layer 410, which may be an n+-type material layer, and the horizontal plane 410P adjacent to (e.g., intersecting an edge of) the side surface 410S2. Here, the nitride semiconductor layer may be a GaN layer, an AlGaN layer or an InGaN layer, but is not limited thereto. The insulating layer 460 may be an oxide layer or a nitride layer. If a material may be used as a gate insulating film, the material may be used as the insulating layer 460. For example, the insulating layer 460 may be a silicon nitride layer, a silicon oxide layer, an aluminum oxide layer, or a hafnium oxide layer, but is not limited thereto. The current blocking layer 415 may include an oxide layer. The current blocking layer 415 may be a compound semiconductor layer doped with a p-type conductivity dopant. The current blocking layer 415 may include a nitride layer. As described herein, the current blocking layer 415 may be formed as a p-type material layer. For example, the current blocking layer 415 may be a p-type nitride semiconductor layer. Here, the current blocking layer 415 may be a nitride semiconductor layer that may be a GaN layer, an AlGaN layer or an InGaN layer, but is not limited thereto. In some example embodiments, due to the current blocking layer 415, no current may flow from the second electrode layer 470 to the MQW layer 425 until a voltage is applied to the third electrode layer 480. As a voltage is applied to the third electrode layer 480, a voltage is applied to the current blocking layer 415 due to the presence of the insulating layer 460. Accordingly, as the voltage applied to the third electrode layer 480 is greater than or equal to a threshold voltage, a channel CH1 through which electrons may flow may be formed in the current blocking layer 415. A carrier (e.g., current) may be supplied from the second electrode layer 470 to the MQW layer 425 through the channel CH1. The current flowing through the channel CH1 may be controlled by controlling the voltage applied to the third electrode layer 480. Restated, the third electrode layer 480 may be configured to form a channel CH1 through which a carrier (e.g., current) may flow in the current blocking layer 415 in response to an operating voltage being applied to the first light-emitting device 100 (e.g., applied to the third electrode layer 480). Accordingly, the current supplied to the MQW layer 425 may be controlled by controlling the voltage applied to the third electrode layer 480. This denotes that the amount of light generated in the MQW layer 425 may be controlled by controlling the voltage applied to the third electrode layer 480. That is, the amount of light emitted from the first light-emitting device 100 may be controlled by controlling the voltage applied to the third electrode layer 480. Therefore, when the first light-emitting device 100 is used as an illumination device, the brightness of the illumination may be controlled, and when the first light-emitting device 100 is used as a light source of a display, the brightness of the display may be controlled. Also, when the first light-emitting device 100 is used as a pixel, brightness of each pixel may be controlled. It will be understood that each of the first, second, third, and fourth material layers 430, 435, 410, 420 may include a separate compound semiconductor layer.

In the related art, a driving transistor for controlling a current supplied to the MQW layer 425 is separately provided outside a light-emitting device, and thus, there is a limitation in increasing the degree of integration of the light-emitting device. However, in the case of the first light-emitting device 100, the third electrode layer 480 that performs as a driving transistor in the related art is not additionally provided outside the first light-emitting device 100 but is included in the first light-emitting device 100, and even, a capacitor may be included in the first light-emitting device 100, and thus, the degree of integration of the first light-emitting device 100 may be increased compared to the related art. Also, since a driving transistor is not separately provided outside the light-emitting device, when a pixel array is implemented by using light-emitting devices, devices like a switching transistor assigned to each pixel are not disposed on a backplane under the light-emitting devices, and may be provided outside the backplane in the form of an array, and thus, a circuit design is easy and the light-emitting device array may be easily attached to the backplane.

Also, an upper functional layer 445 may be disposed on the first electrode layer 440 of the first light-emitting device 100, such that the first electrode layer 440 may be connected to a functional layer (e.g., upper functional layer 445). The upper functional layer 445 may include a first functional layer that is provided to utilize light emitted from the first light-emitting device 100 as illumination or a pixel and a first substrate. The upper functional layer 445 will be described below. The upper functional layer 445 may include one of a fluorescent layer, a quantum dot layer, or a color filter. The second and third electrode layers 470 and 480 of the first light-emitting device 100 may contact the lower functional layer 490 provided thereunder. The lower functional layer 490 may include a second substrate and a second functional layer on the second substrate. The second functional layer may include a device related to an operation of the first light-emitting device 100, for example, a switching transistor 330 and a circuit for controlling the operation of the first light-emitting device 100. Accordingly, the third electrode layer 480 may be connected to a switching transistor 330. The second substrate may include, for example, a silicon substrate or a glass substrate. The lower functional layer 490 may be the backplane described above, and the second substrate may be a substrate of the backplane. Accordingly, when a light-emitting device array, such as an illumination array or a pixel array, is formed by using a plurality of first light-emitting devices 100, a switching transistor array is separately formed outside the backplane, and the light-emitting device array and the switching transistor array mounted on the backplane may be connected by wiring.

In FIG. 1, the first electrode layer 440 may be referred to as an upper electrode layer or a lower electrode layer according to a relative position. For example, when the first electrode layer 440 is on the MQW layer 425, the first electrode layer 440 may be referred to as an upper electrode layer, and when the first electrode layer 440 is below the MQW layer 425, the first electrode layer 440 may be referred to as a lower electrode layer. The second and third electrode layers 470 and 480 may be collectively referred to as an electrode layer. Accordingly, when the second and third electrode layers 470 and 480 are on the MQW layer 425, the second and third electrode layers 470 and 480 may be collectively referred to as an upper electrode layer, and the second and third electrode layers 470 and 480 are below the MQW layer 425, the second and third electrode layers 470 and 480 may be collectively referred to as a lower electrode layer, This description may be applied to other devices described below.

FIG. 2 shows a case that top and bottom of the first light-emitting device 100 of FIG. 1 is reversed. In the case, the first electrode layer 440 is disposed below the MQW layer 425, and the second and third electrode layers 470 and 480 are disposed on the MQW layer 425 with respect to the MQW layer 425. The remaining part is the same as in FIG. 1.

Figure 3:
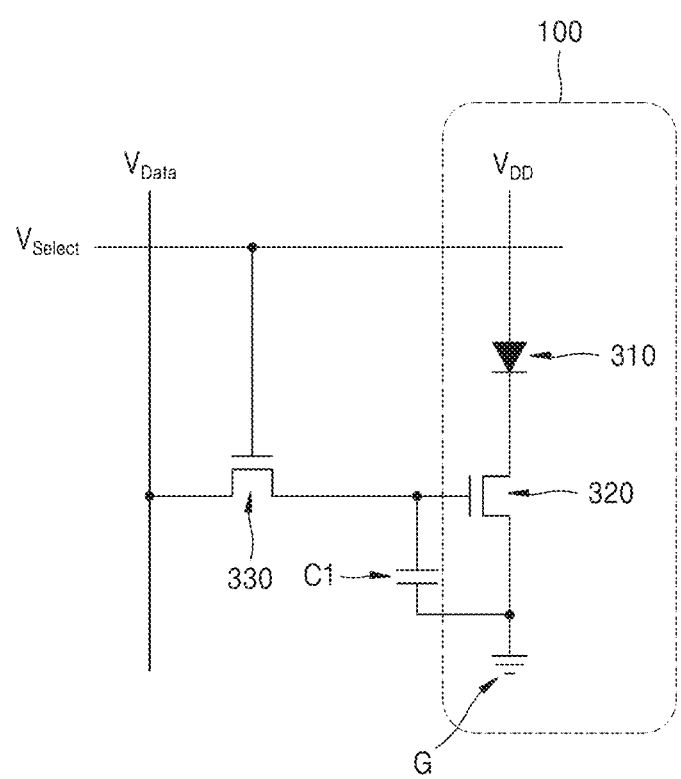
FIG. 3 is a circuit diagram illustrating an equivalent circuit of the light-emitting device of FIG. 1.

FIG. 3 shows an equivalent circuit of a pixel including the first light-emitting device 100 of FIG. 1.

Referring to FIG. 3, in the equivalent circuit, the first light-emitting device 100 includes a light-emitting diode 310 and a driving transistor 320. The driving transistor 320 may correspond to the third electrode layer 480 formed as a gate electrode for controlling a current supplied to the first light-emitting device 100. Restated, the third electrode layer 480 may include a gate electrode of the driving transistor 320. The light-emitting diode 310 and the driving transistor 320 are connected in series. A switching transistor 330 is connected to the driving transistor 320. A capacitor C1 is connected between the gate and the cathode of the driving transistor 320. As shown in FIG. 3, the capacitor C1 may be connected between the gate electrode of the driving transistor 320 and a ground terminal G. The capacitor C1 may be provided outside the first light-emitting device 100.

Figure 4:
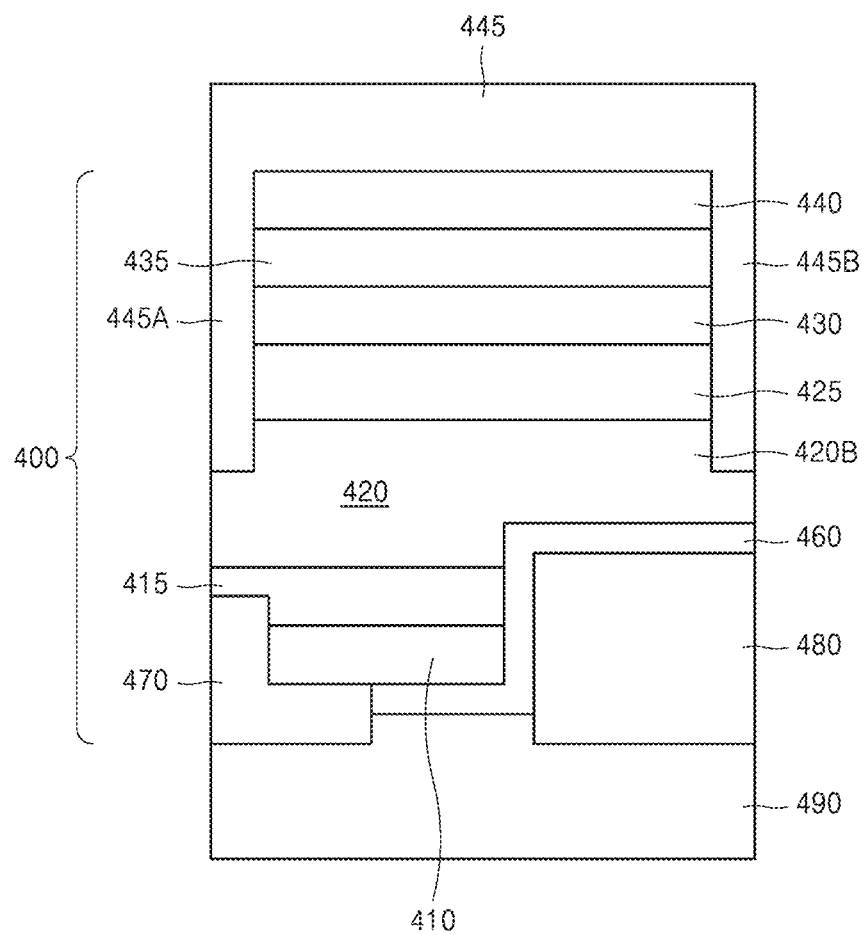
FIG. 4 is a cross-sectional view of a light-emitting device according to some example embodiments.

FIG. 4 shows a second light-emitting device 400 including a driving transistor, according to some example embodiments. Only parts different from the first light-emitting device 100 of FIG. 1 will be described. Like reference numerals indicate elements that are identical to the elements of the first light-emitting device 100 of FIG. 1.

Referring to FIG. 4, in the second light-emitting device 400, the fourth material layer 420 includes an upwardly protruding portion 420B. The MQW layer 425, the first material layer 430, the second material layer 435, and the first electrode layer 440 are sequentially stacked on an upper surface of the upwardly protruding portion 420B of the fourth material layer 420. Widths of the MQW layer 425, the first material layer 430, the second material layer 435, and the first electrode layer 440 may be equal to a width of the upwardly protruding portion 420B of the fourth material layer 420. The entire upper surface of the first electrode layer 440 is covered by the upper functional layer 445. The upper functional layer 445 includes first and second extended portions 445A and 445B that downwardly extend from both sides thereof. The first extended portion 445A covers left sides of the upwardly protruding portion 420B of the fourth material layer 420, the MQW layer 425, the first material layer 430, the second material layer 435, and the first electrode layer 440. The second extended portion 445B covers right sides of the upwardly protruding portion 420B of the fourth material layer 420, the MQW layer 425, the first material layer 430, the second material layer 435, and the first electrode layer 440. Lower ends of the first and second extended portions 445A and 445B cover the upper surface of the fourth material layer 420 around the upwardly protruding portion 420B. As a result, the upper functional layer 445 is in the form of a cap surrounding the stack therebelow.

Figure 5:
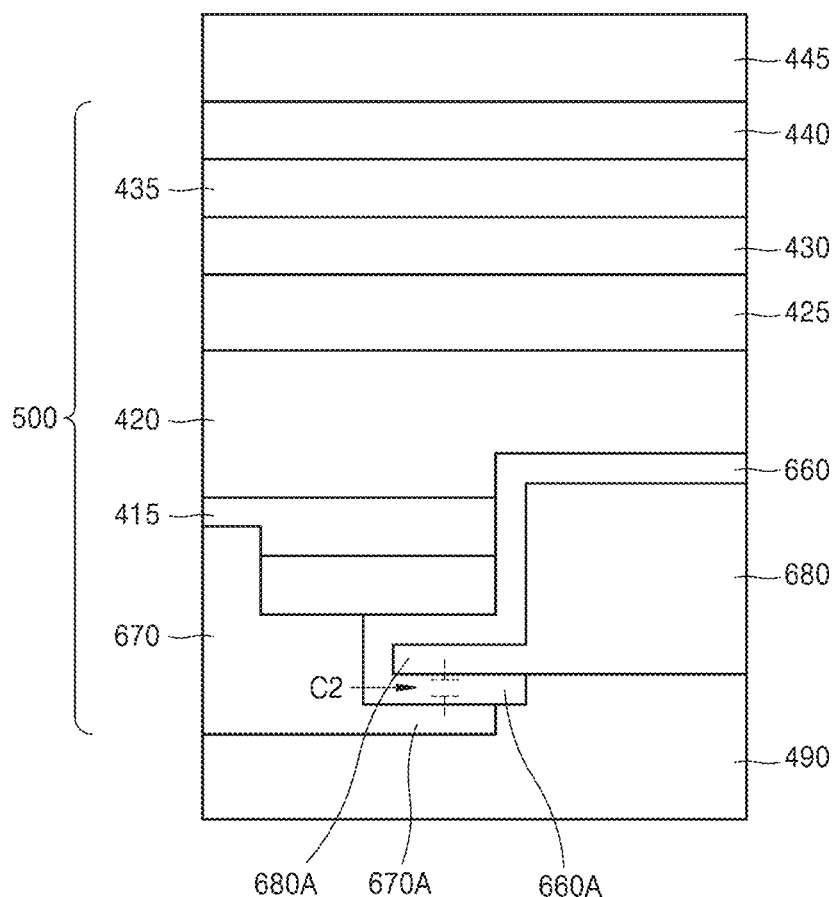
FIG. 5 is a cross-sectional view of a light-emitting device according to some example embodiments.

FIG. 5 shows a third light-emitting device 500 including a driving transistor according to some example embodiments. Only parts different from the first light-emitting device 100 of FIG. 1 will be described. Like reference numerals indicate elements that are identical to the elements of the first light-emitting device 100 of FIG.

Referring to FIG. 5, in the third light-emitting device 500, the second electrode layer 670 used as a cathode electrode and the third electrode layer 680 used as a gate electrode are configured to form a capacitor C2 therebetween, such that the third light-emitting device 500 includes the capacitor C2 between the second electrode layer 670 and the third electrode layer 680.

In detail, the second electrode layer 670 and the third electrode layer 680 include protrusions or extension units (e.g., "portions") facing each other. That is, the second electrode layer 670 includes a first extended portion 670A that extends toward the third electrode layer 680, as shown in FIG. 5. The third electrode layer 680 includes a second extended portion 680A extending toward the second electrode layer 670, as shown in FIG. 5. The first and second extended portions 670A and 680A are staggered from each other. The first extended portion 670A is located below the second extended portion 680A. However, the second extended portion 680A may be provided below the first extended portion 670A. The first and second extended portions 670A and 680A are parallel to each other and separated from each other. Lengths of the first and second extended portions 670A and 680A may be equal to or different from each other, but the first and second extended portions 670A and 680A may have an appropriate length considering the formation of a capacitor. A first insulating layer 660 extends between the first and second extended portions 670A and 680A. As a result, a gap between the first and second extended portions 670A and 680A is filled with an extended portion 660A of the first insulating layer 660 (e.g., a portion of the gate insulating layer). As a result, as shown in FIG. 5, the first extended portion 670A, the extended portion 660A of the first insulating layer 660, and the second extended portion 680A form a sequentially stacked layer structure, for example such that, as shown in FIG. 5, a portion of the second electrode layer 670, a portion of the gate insulating layer (e.g., first insulating layer 660), and a portion of the third electrode layer 680 are sequentially stacked. Since the first and second extended portions 670A and 680A are electrode layers, the stacked layer structure has a layer structure in which includes a sequentially stacked an electrode layer, an insulating layer and an electrode layer. This kind of layer structure denotes a capacitor.

In this way, since the first and second extended portions 670A and 680A and the extended portion 660A of the first insulating layer 660 therebetween form a capacitor, as a result, a capacitor is formed between the second electrode layer 670 and the third electrode layer 680. This capacitor may be a driving capacitor of the third light-emitting device 500.

In the case of the third light-emitting device 500, since a driving capacitor is also included in the third light-emitting device 500 together with the third electrode layer 680 used as a gate electrode, the number of devices disposed on the backplane may be reduced together with the increase in the degree of integration of the light-emitting device array, and as a result, the configuration of the backplane may be simplified. As a result, a margin may be increased in a process disposing devices in the backplane.

In FIG. 5, reference numeral C2 symbolically indicates a capacitor formed by including the first and second extended portions 670A and 680A and the extended portion 660A of the first insulating layer 660.

Figure 6:
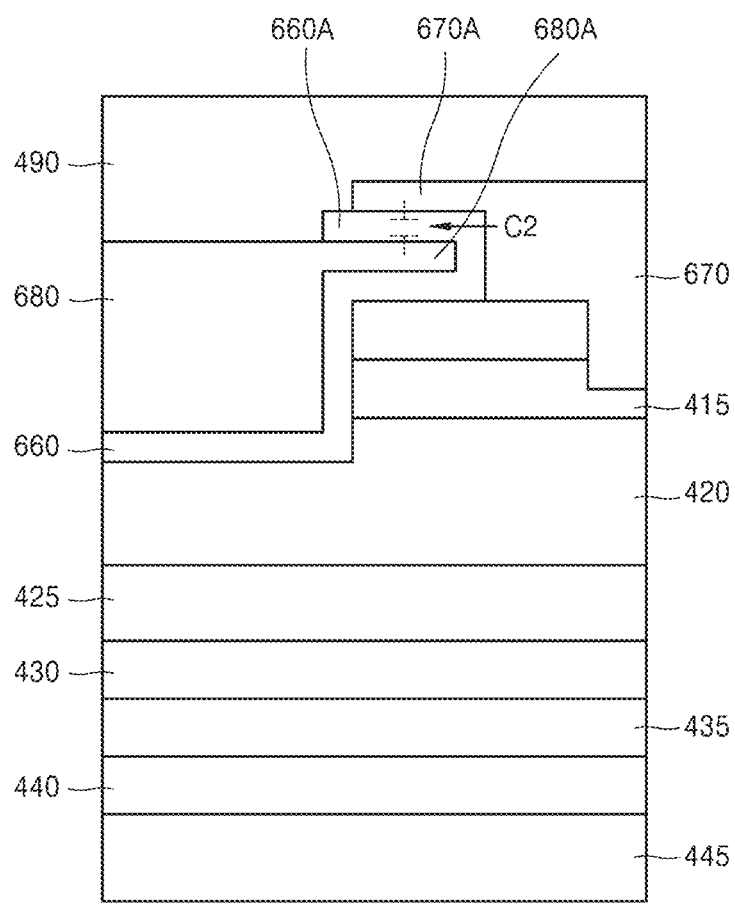
FIG. 6 is a cross-sectional view of an inversion of upper and lower sides of the light-emitting device of FIG. 5.

FIG. 6 shows a case in which top and bottom of the third light-emitting device 500 of FIG. 5 is reversed. In the case of the third light-emitting device 500 shown in FIG. 6, the first extended portion 670A of the second electrode layer 670 is disposed on the second extended portion 680A of the third electrode layer 680.

Figure 7:
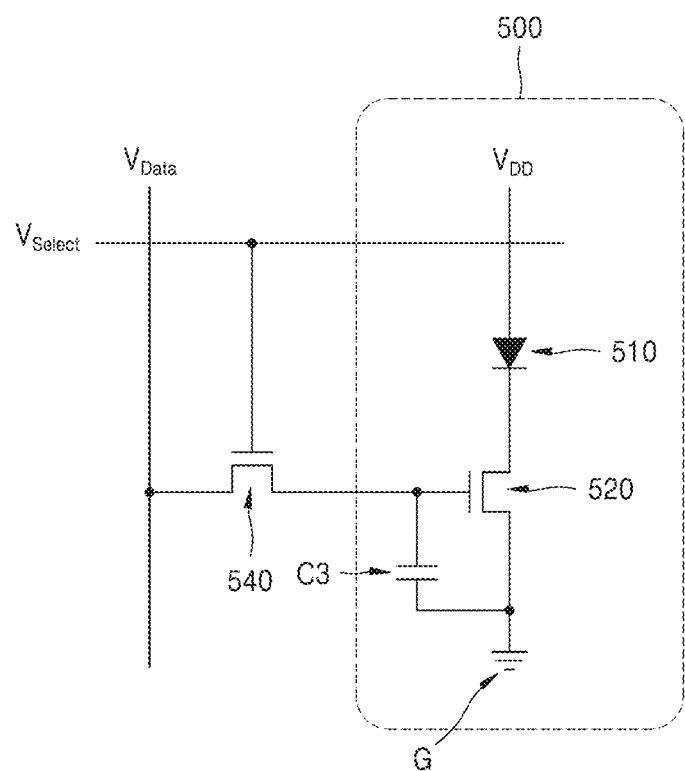
FIG. 7 is a circuit diagram illustrating an equivalent circuit of the light-emitting device of FIG. 5.

FIG. 7 shows an equivalent circuit of a pixel including the third light-emitting device 500 of FIG. 5.

Referring to FIG. 7, the equivalent circuit includes a switching transistor 540 and the third light-emitting device 500. The third light-emitting device 500 includes a light-emitting diode 510, a driving transistor 520, and a capacitor C3. The driving transistor 520 may correspond to the third electrode layer 680 formed as a gate electrode for controlling a current supplied to the third light-emitting device 500. The light-emitting diode 510 and the driving transistor 520 are connected in series. The switching transistor 540 is connected to the driving transistor 520. The capacitor C3 is connected between a gate and a cathode of the driving transistor 520.

Figure 8:
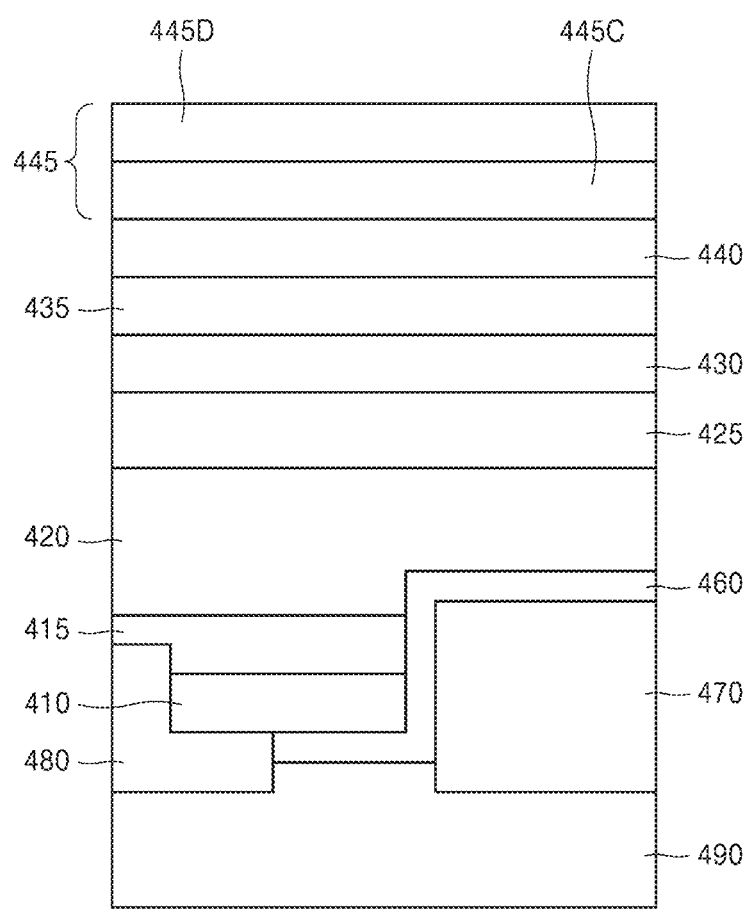
FIG. 8 is a cross-sectional view of a light-emitting device, in which a color filter is included in a functional layer, according to some example embodiments.

FIG. 8 shows a first example of an upper functional layer 445 provided on the first electrode layer 440 used as an anode of the first light-emitting device 100 of FIG. 1.

Referring to FIG. 8, the upper functional layer 445 formed on the first electrode layer 440 may include a light-emitting layer 445C and a transparent substrate 445D sequentially stacked. The transparent substrate 445D is a substrate transparent to incident light, and may be used as a supporter or a support substrate in a manufacturing process of the light-emitting device. The light-emitting layer 445C may be a layer that converts light given from the MQW layer 425 into light suitable for display. The light-emitting layer 445C may be a layer that filters the light given from the MQW layer 425 to be suitable for display. As an example, the light-emitting layer 445C may include a fluorescence layer or a phosphorescence layer capable of emitting light having a specific wavelength in response to light given from the MQW layer 425. As another example, the light-emitting layer 445C may include a color filter layer that supplies light of a specific color (for example, at least one of red, green, or blue) required by the display by filtering light provided from the MQW layer 425 to the display. In this case, the color filter layer may be a monochromatic color filter layer that, as a whole, emits a single color. When the light-emitting device of FIG. 8 is used as a pixel, the color filter layer may include a region emitting red light, a region emitting green light, and a region emitting blue light.

Figure 9:
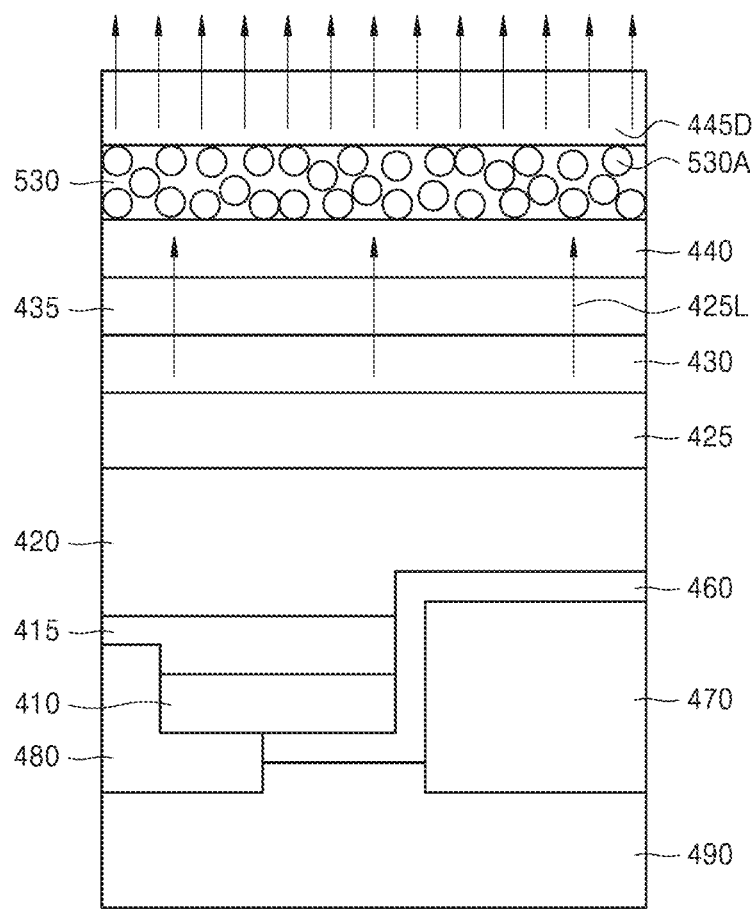
FIG. 9 is a cross-sectional view illustrating a light-emitting device, in which quantum dots realizing R(Red), G(Green), and B(Blue) colors are included in a functional layer, according to some example embodiments.

FIG. 9 shows a case where a quantum dot layer 530 is provided at a position of the light-emitting layer 445C of FIG. 8. The quantum dot layer 530 includes a plurality of quantum dots 530A. The plurality of quantum dots 530A may be uniformly or evenly distributed throughout the quantum dot layer 530. The plurality of quantum dots 530A emit light suitable for a display in response to light 425L given from the MQW layer 425. The quantum dot layer 530 uniformly diffuses or scatters light 425L incident from the MQW layer 425 so that light of uniform intensity is incident on an entire light incident surface of the display.

When the light-emitting device of FIG. 9 is used as a pixel, the quantum dot layer 530 may be divided into a region emitting red light, a region emitting green light, and a region emitting blue light, and optical characteristics of the quantum dots present in each region (for example, characteristics in response to incident light) may be different from each other.

In FIG. 9, when light emitted from the MQW layer 425 is one of red light, green light, or blue light instead of white light, for example, blue light, quantum dots in a region emitting blue light in the quantum dot layer 530 may be removed.

Figure 10:
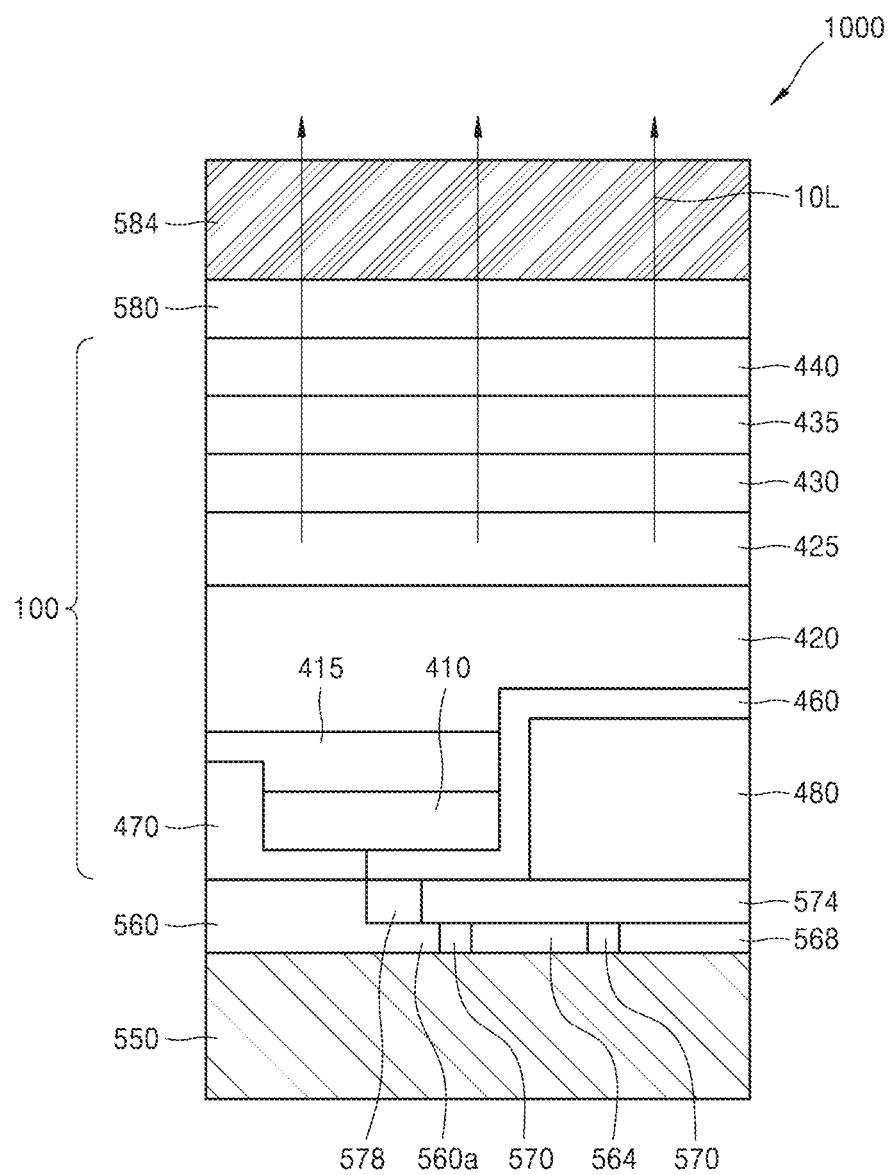
FIG. 10 is a cross-sectional view showing a first display device including a light emitting device according to an embodiment.

FIG. 10 shows a first display device 1000 including the first light emitting device 100 of FIG. 1.

Referring to FIG. 10, first to third wirings 560, 564, and 568 are disposed on the panel 550. The panel 550 may be a backplane including elements, for example, a transistor or a capacitor used for a display operation. The first to third wirings 560, 564, and 568 may be conductive layers to which a voltage is applied or a current is transmitted. The first to third wirings 560, 564, and 568 are separated from each other. The first to third wirings 560, 564, and 568 do not directly contact each other. The formation locations of the first to third wirings 560, 564, and 568 on the panel 550 may be different from each other. The first to third wirings 560, 564, and 568 may have different thicknesses from each other. For example, the first wiring 560 may have a thickness greater than those of the second and third wirings 564 and 568. The first wiring 560 may include a first portion 560a having the same thickness as the second and third wirings 564 and 568. The second and third wirings 564 and 568 may have the same thickness. The second wiring 564 is located between the first wiring 560 and the third wiring 568 on the panel 550. A first interlayer insulating layer 570 is provided between the first portion 560a of the first wring 560 and the second wiring 564 and between the second wiring 564 and the third wiring 568 on the panel 550. A switching circuit unit (switching IC) 574 is provided on the first portion 560a of the first wiring 560, the second wiring 564, and the third wiring 568. The switching circuit unit 574 may cover a part of the first wiring 560 and may directly contact the first wiring 560. The switching circuit part 574 may cover the second and third wirings 564 and 574, and may also cover the first interlayer insulating layer 570 therebetween. The switching circuit unit 574 may be located between the first light-emitting device 100 and the first to third wirings 560, 564, and 568. The switching circuit unit 574 may include a circuit provided to control the operation of a device provided in the panel 550 and to control the operation of the first light-emitting device 100. For example, the switching circuit unit 574 may include a circuit for controlling an amount of light and/or the intensity of light emitted from the first light-emitting device 100. A voltage and/or current applied to the gate electrode 480 may be controlled by the switching circuit unit 574. The panel 550, the first to third wirings 560, 564, and 568, and the switching circuit unit 574 may be collectively referred to as a panel. The first light-emitting device 100 is present on the first to third wirings 560, 564, and 568 and the switching circuit unit 574. The second electrode layer 470 may be located on the first wiring 560, and the third electrode layer 480 may be located on a portion of the switching circuit unit 574. The first wiring 560 may directly contact the second electrode layer 470. The switching circuit unit 574 and the third electrode layer 480 may be directly connected to each other. The height of an upper surface of the thick portion of the first wiring 560 and the height of an upper surface of the switching circuit unit 574 may be the same from each other. A second interlayer insulating layer 578 is formed between the thick portion of the first wiring 560 and the switching circuit portion 574. The second interlayer insulating layer 578 is located on the first portion 560a of the first wiring 560. A common voltage Vcommon may be applied through the first wiring 560. A selection voltage Vselect may be applied through the second wiring 564. A data voltage Vdata may be applied through the third wiring 568. A fourth wiring 580 and a display panel 584 are sequentially stacked on the first light-emitting device 100. The display panel 584 may be a transparent panel, for example, a glass plate. The fourth wiring 580 is provided on the first electrode layer 440 of the first light-emitting device 100. The fourth wiring 580 may directly contact the first electrode layer 440, but another conductive member may be disposed between the fourth wiring 580 and the first electrode layer 440. The another conductive member may include, for example, a conductive material provided to reduce a contact resistance between the fourth wiring 580 and the first electrode layer 440. Each of the first to fourth wirings 560, 564, 568, and 580 may be a single layer, but in another embodiment, each may constitute multiple layers. Reference numeral 10L denotes light emitted from the MQW layer 425 which is an active layer. Light 10L is emitted toward the first electrode layer 440. The light 10L sequentially passes through the first electrode layer 440 and the display panel 584 and then is emitted. As a result, the first light-emitting device 100 may be a surface emitting device.

Figure 11:
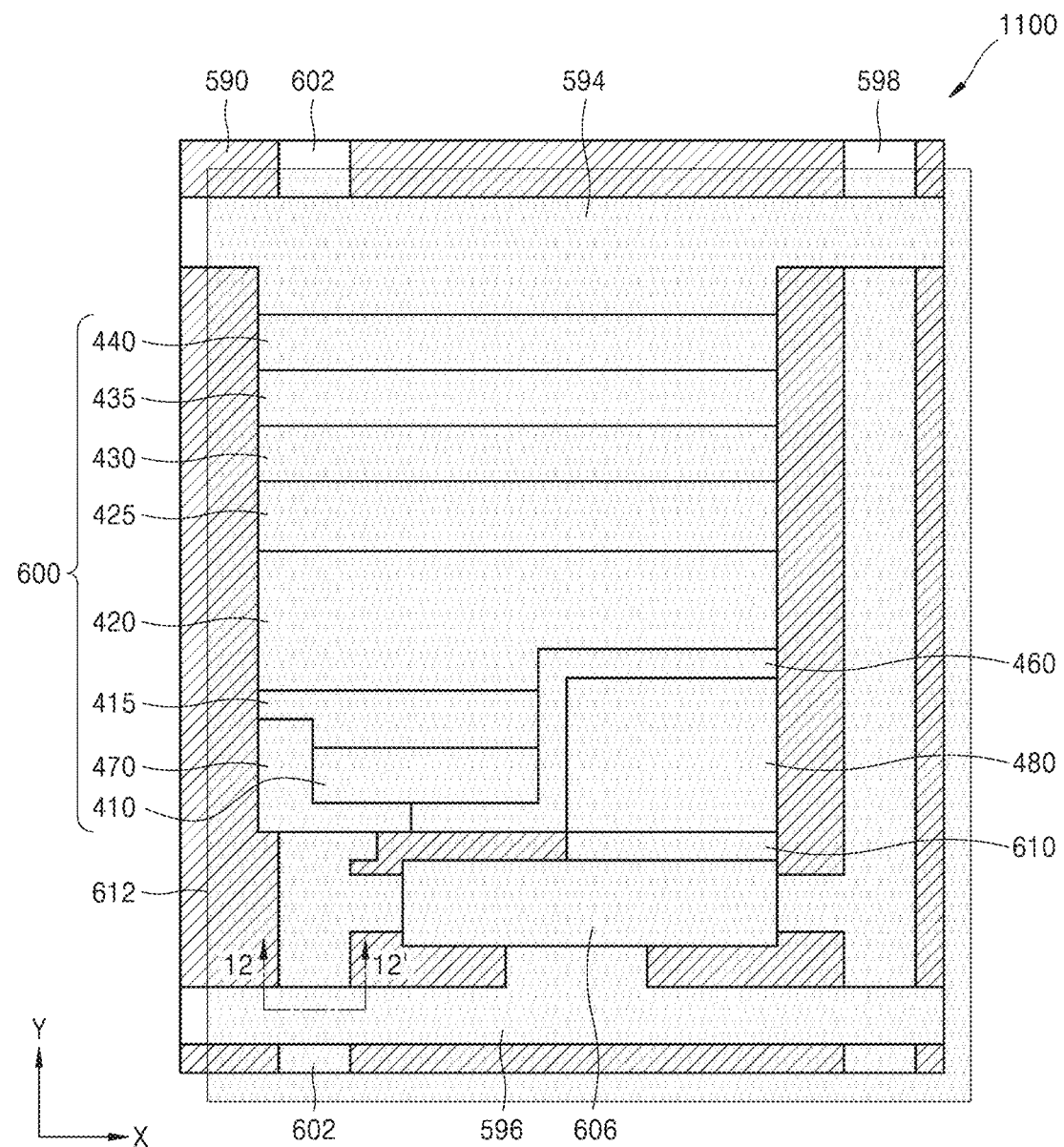
FIG. 11 is a plan view showing a second display device including a light emitting device according to an embodiment.

FIG. 11 shows a second display device 1100 including the second light-emitting device 600.

Referring to FIG. 11, the second display device 1100 includes a first panel 590, a second light-emitting device 600, a switching circuit unit 606, first to fourth wirings 594, 596, 598, and 602, and a second panel 612. The first and second panels 590 and 612 may be parallel to each other. The first panel 590 is a wafer or a backplane, and may include the same or similar configuration to the panel 550 of the first display device 1000. The second panel 612 may be a transparent substrate, for example, the same as the display panel 584 of FIG. 10. The entire second panel 612 overlaps the first panel 590 on the first panel 590, but is shown as slightly deviated from each other for identification of the first and second panels 590 and 612. The second light-emitting device 600, the switching circuit unit 606, and the first to fourth wirings 594, 596, 598, and 602 are disposed on the first panel 590, and between the first panel 590 and the second panel 612. The second light-emitting device 600 may be an edge light-emitting device in which light is emitted to a side of the MQW layer 425 unlike the first light-emitting device 100 which is a surface emitting device. Accordingly, in FIG. 11, light emitted from the MQW layer 425 may be emitted in a direction perpendicular to the paper, that is, in a direction perpendicular to the first panel 590. The first to fourth wirings 594, 596, 598, and 602 may be provided between the first panel 590 and the second light-emitting device 600. That is, the second light-emitting device 600 may be disposed on at least a portion of the first to fourth wirings 594, 596, 598, and 602. One end or a portion of each of the first to fourth wirings 594, 596, 598, and 602 may be in direct contact with the second light-emitting device 600. In each of the first to fourth wirings 594, 596, 598, and 602, a rest portion of each of the first to fourth wirings 594, 596, 598, and 602 except for the portion in contact with the second light emitting device 600 may be separated from the second light emitting device 600. An insulating layer may be present between the rest portion of the first to fourth wirings 594, 596, 598, and 602 and the second light-emitting device 600. The third wiring 598 to which a selection voltage Vselect is applied is separated from the second light-emitting device 600, and a part of the third wiring 598 is connected to a switching circuit unit 606. The third wiring 598 and the fourth wiring 602 may be disposed to be parallel to each other. The fourth wiring 602, to which a common voltage Vcommon is applied, is disposed to pass under the second light-emitting element 600. The fourth wiring 602 may contact a cathode 470 and the switching circuit unit 606. The first wiring 594 to which a VDD voltage is applied and the second wiring 596 to which a data voltage Vdata is applied may be disposed to be parallel to each other. The first wiring 594 may be connected to the first electrode layer 440. The second wiring 596 may be connected to the switching circuit unit 606. The first and second wirings 594 and 596 may be disposed perpendicular to the third and fourth wirings 598 and 602. The second light-emitting device 600 may be one of a plurality of light-emitting devices constituting an array of light-emitting devices. At least some of the first to fourth wirings 594, 596, 598, and 602 may be shared with light-emitting devices adjacent to the second light-emitting device 600. The basic role and operation of the switching circuit unit 606 may not be different from the switching circuit unit 574 of the first display device 1000. The switching circuit unit 606 may be connected to the first to fourth wirings 594, 596, 598, and 602, for example, the second wiring 596, the third wiring 598, and the fourth wiring 602. A fifth wiring 610 may be provided between the switching circuit unit 606 and the third electrode layer 480. A control signal may be given to the third electrode layer 480 used as a gate electrode through the fifth wiring 610. The switching circuit unit 606 may be provided on the second to fourth wirings 596, 598, and 602. The switching circuit unit 606 may be disposed next to the second light-emitting device 600. The switching circuit unit 606 is separated from the second light-emitting device 600. The layer configuration of the second light-emitting device 600 may be the same as or similar to the first light-emitting device 100. However, since the second light-emitting device 600 is an edge light-emitting device, light reflection/transmission characteristics of both sides of the MQW layer 425 may be different. The internal light reflectance of a side surface close to the first panel 590 among both sides of the MQW layer 425 may be greater than that of the other side. Accordingly, light generated from the MQW layer 425 is emitted through a side surface close to the second panel 612 among the both sides of the MQW layer 425. That is, light generated from the MQW layer 425 is emitted in a direction perpendicular to the paper, that is, positive direction of a Z-axis. All of layers included in the second light-emitting device 600 exist horizontally on the first panel 590 parallel to each other. For example, on the first panel 590, the first electrode layer 440 may be present on the left side, and the cathode 470 and the gate electrode 480 may be located on the right side of the MQW layer 425, and the cathode 470 and the gate electrode 480 may be located between the MQW layer 425 and the switching circuit 606.

Figure 12:
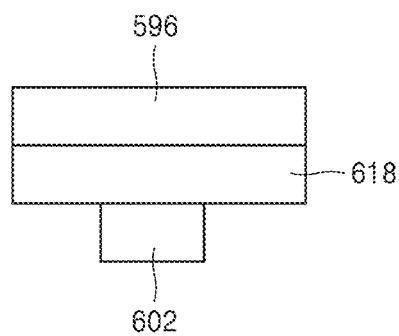
FIG. 12 is a cross-sectional view taken along a line 12-12' of FIG. 11.

FIG. 12 shows a cross-sectional view taken along a line 12-12' of FIG. 11.

Referring to FIG. 12, an insulating layer 618 is formed between the fourth wiring 602 and the second wiring 596 that are sequentially stacked. In this way, in FIG. 11, an insulating layer exists between the first to fourth wirings 594, 596, 598, and 602 in the region where the first to fourth wirings 594, 596, 598, and 602 overlap from each other. Accordingly, the first to fourth wirings 594, 596, 598, and 602 do not contact each other.

Figure 13:
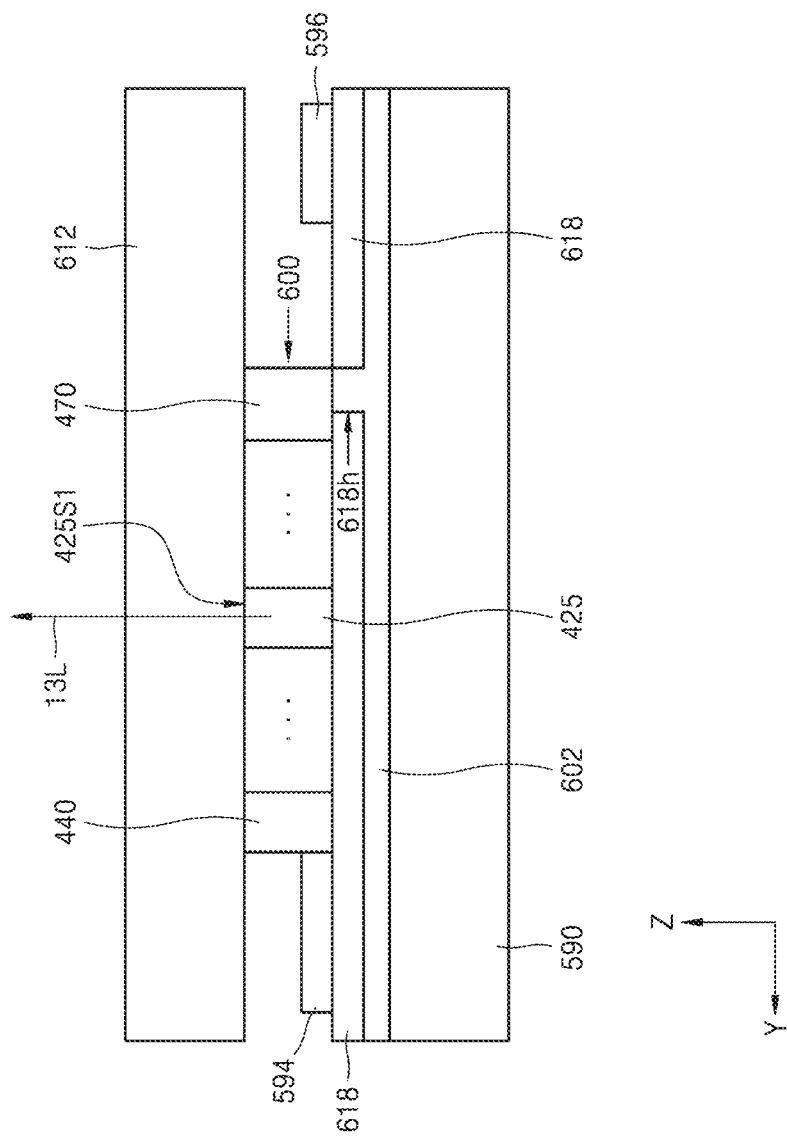
FIG. 13 is a side view seen in an x-axis direction of a second display device of FIG. 11.

FIG. 13 is a side view seen in an X-axis direction of FIG. 11.

Referring to FIG. 13, the fourth wiring 602 is formed on the first panel 590. The insulating layer 618 is formed on the fourth wiring 602. The fourth wiring 602 is in contact with the cathode 470 of the second light-emitting device 600 through a via hole 618h formed in the insulating layer 618. The second light-emitting device 600 and the first and second wirings 594 and 596 are present on the insulating layer 618. The first wiring 594 is on the left side of the second light-emitting device 600, and the second wiring 596 is on the right side of the second light-emitting device 600. The first wiring 594 contacts the first electrode layer 440 of the second light-emitting device 600. The second light-emitting device 600 may be formed so that the cathode 470 is located directly on the via hole 618h. The second panel 612 covering the entire second light-emitting device 600 and the entire first and second wirings 594 and 596 is present on the second light-emitting device 600. The second panel 612 may be parallel to the first panel 590. On the insulating layer 618, the first electrode layer 440, the MQW layer 425, and the cathode 470 of the second light-emitting device 600 are horizontally arranged to be parallel to each other. For convenience of illustration, layers disposed between the first electrode layer 440 and the MQW layer 425 and layers disposed between the MQW layer 425 and the cathode 470 are omitted. Reference numeral 13L denotes light emitting through a side surface 425S1 close to the second panel 612 of both sides of the MQW layer 425.

Next, a method of manufacturing a light-emitting device including a driving device, according to some example embodiments, will be described with reference to FIGS. 14, 15, 16, 17, 18, 19, 20, 21, and 22. In the following descriptions, like reference numerals used to indicate elements described above refer to the same elements, and the description thereof will be omitted.

Figure 14:
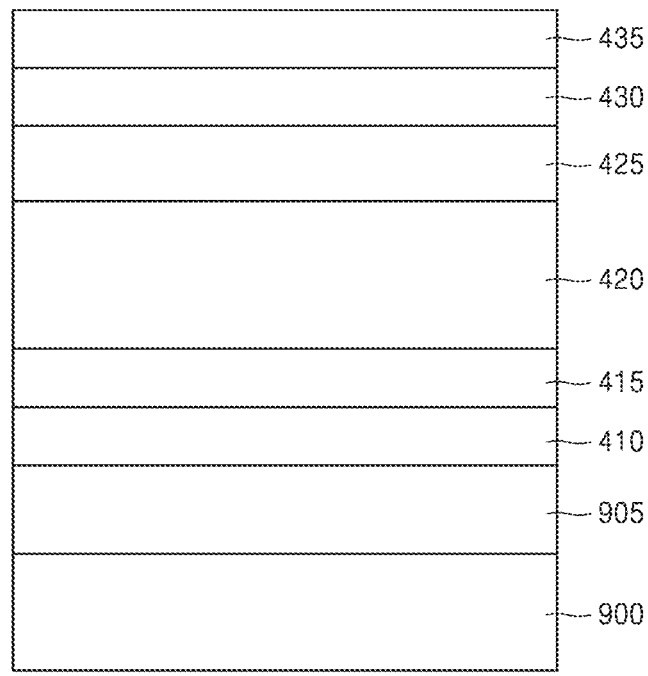
FIGS. 14, 15, 16, 17, 18, 19, 20, 21, and 22 are cross-sectional views illustrating a method of manufacturing a light-emitting device, according to some example embodiments.

Referring to FIG. 14, a buffer layer 905, a third material layer 410, a current blocking layer 415, a fourth material layer 420, an MQW layer 425, a first material layer 430, and a second material layer 435 are sequentially stacked (e.g., formed) on a substrate 900. The substrate 900 may be, for example, a sapphire substrate or a silicon substrate. The buffer layer 905, the third material layer 410, the current blocking layer 415, the fourth material layer 420, the MQW layer 425, the first material layer 430, and the second material layer 435 may be formed by using a growth method, for example, an epitaxial growth method. In the formation process, with respect to a material layer that requires doping, the material layer may be doped at a given doping concentration (e.g., the third and/or fourth material layers 410 and 420 may be doped with a first conductive type dopant and the first and/or second material layers 430 and 435 may be doped with a second conductive type dopant). The forming the third and fourth material layers 410 and 420 may include sequentially forming an n+-type material layer (e.g., third material layer 410) and an n-type material layer (e.g., fourth material layer 420). The forming the first and second material layers 430 and 435 may include sequentially forming a p+-type material layer (e.g., second material layer 435) and a p-type material layer (e.g., first material layer 430).

Figure 15:
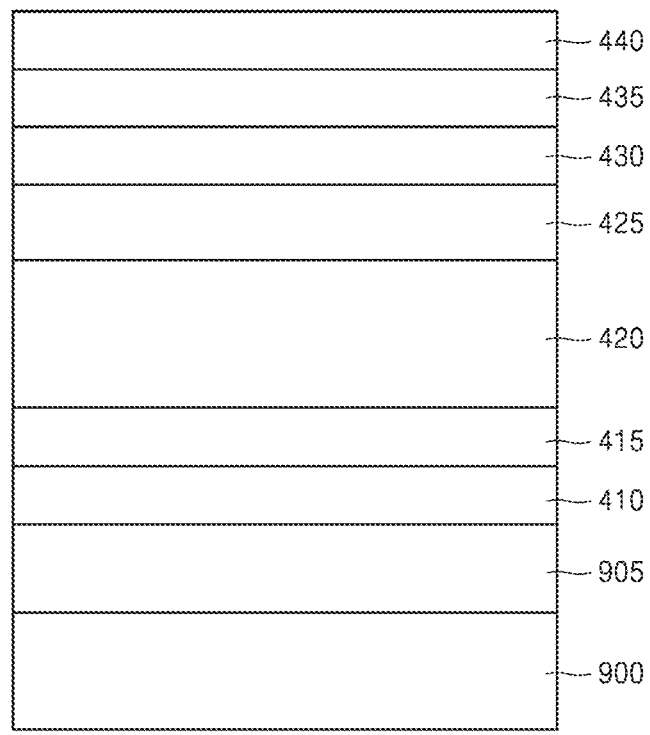

Next, as shown in FIG. 15, the first electrode layer 440 used as an anode is formed, as an upper electrode layer, on the second material layer 435. The first electrode layer 440 may be formed by using an electrode material transparent to light, for example, ITO, but is not limited thereto. The fourth material layer 420 may be referred to as a first portion of a first material layer formed on the substrate 900 so as to be formed between the current blocking layer 415 and the MQW layer 425, and the third material layer 410 may be referred to as another portion of the first material layer that is formed between the current blocking layer 415 and a lower electrode layer (e.g., the second and third electrode layers 470 and 480).

Figure 16:
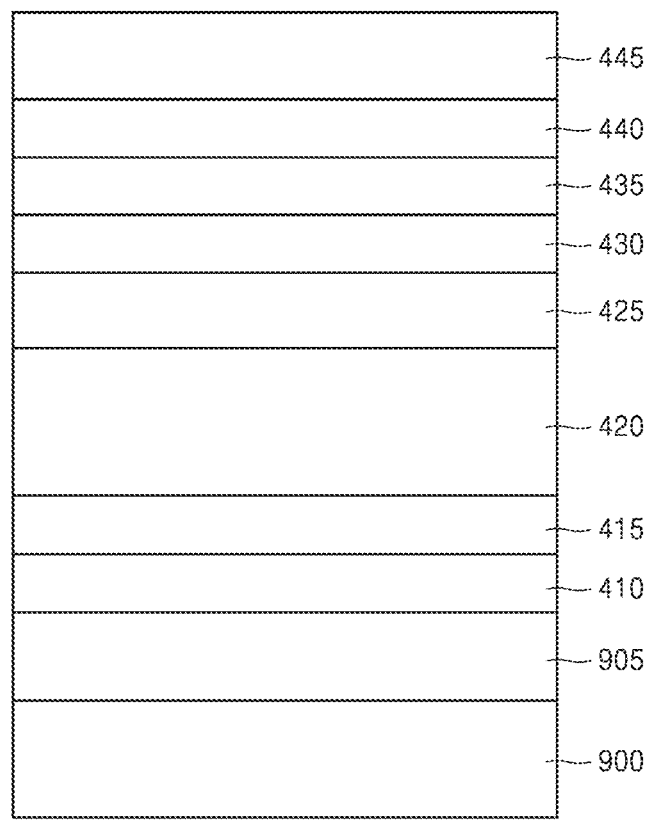

Next, as shown in FIG. 16, the upper functional layer 445 is formed on the first electrode layer 440. The upper functional layer 445 includes a transparent substrate 445D as a supporting substrate as shown in FIG. 8 or 9. In some example embodiments, the operations shown in FIG. 16 may be omitted, such that the upper functional layer 445 is not formed on the first electrode layer 440.

Figure 17:
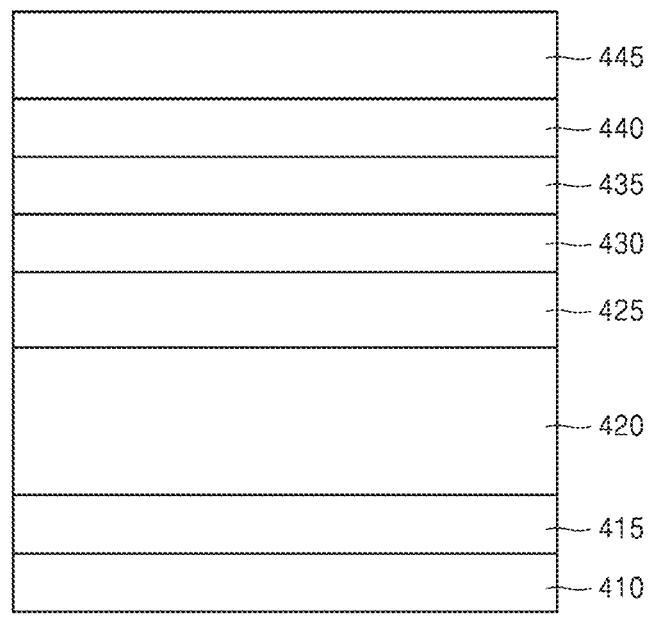

Next, as shown in FIG. 17, the substrate 900 and the buffer layer 905 are removed from the resultant product in which the upper functional layer 445 is formed.

Figure 18:
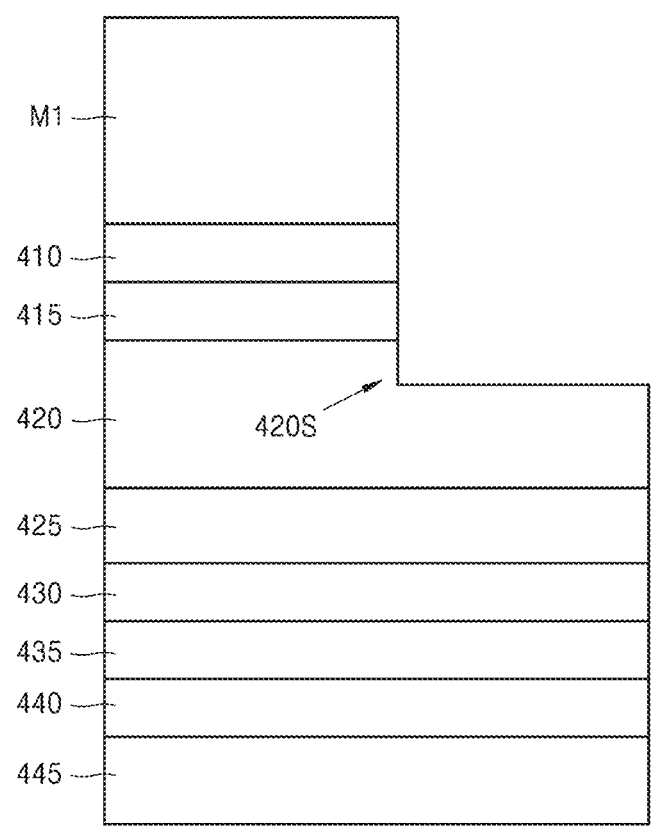

Next, as shown in FIG. 18, the resultant product of FIG. 17 is reversed so that the upper functional layer 445 is positioned below. Next, a first mask M1 that defines a portion of the third material layer 410 and exposes the remaining portion of the third material layer 410 is formed on the third material layer 410. The first mask M1 may be a photosensitive film. After the first mask M1 is formed, the exposed portion of the third material layer 410 around the first mask M1 is etched. The etching may be performed until the exposed portion of the third material layer 410 is removed, a portion of the current blocking layer 415 corresponding to the exposed portion of the third material layer 410 is removed, and a portion of the fourth material layer 420 corresponding to the exposed portion of the third material layer 410 is exposed. The etching may continue until a thickness of the exposed portion of the fourth material layer 420 is lowered to a given thickness after the portion of the fourth material layer 420 is exposed. Due to the etching, the step difference 420S is formed on the upper surface of the fourth material layer 420. A thickness of a left portion of the step difference 420S of the fourth material layer 420 is greater than a thickness of a right portion of the step difference 420S. As a result of the etching, the left portion of the step difference 420S of the fourth material layer 420 protrudes and the current blocking layer 415 and the third material layer 410 are sequentially stacked on an upper surface of the protruding portion of the fourth material layer 420. After the etching, the first mask M1 is removed.

Figure 19:
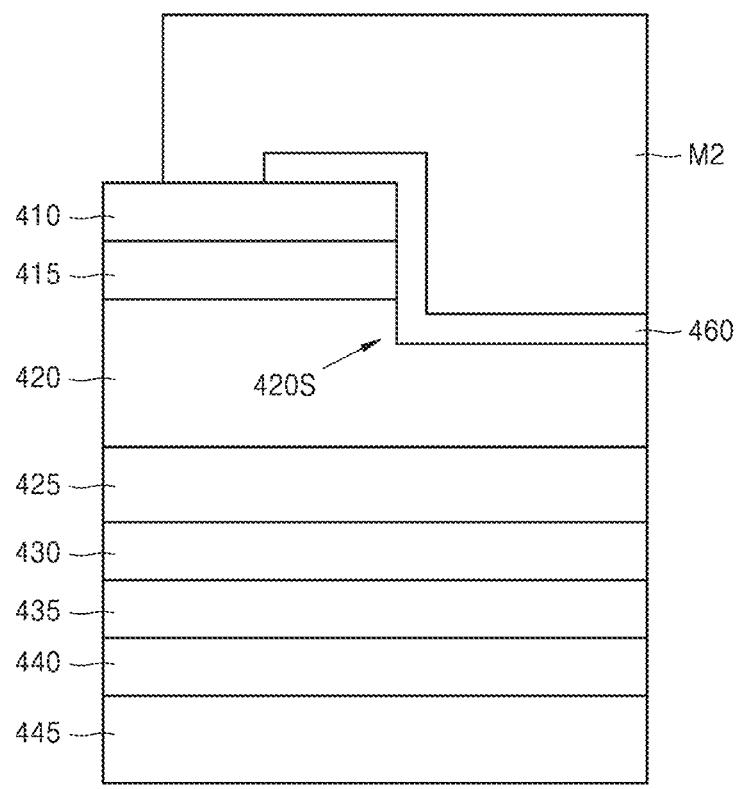
Figure 20:
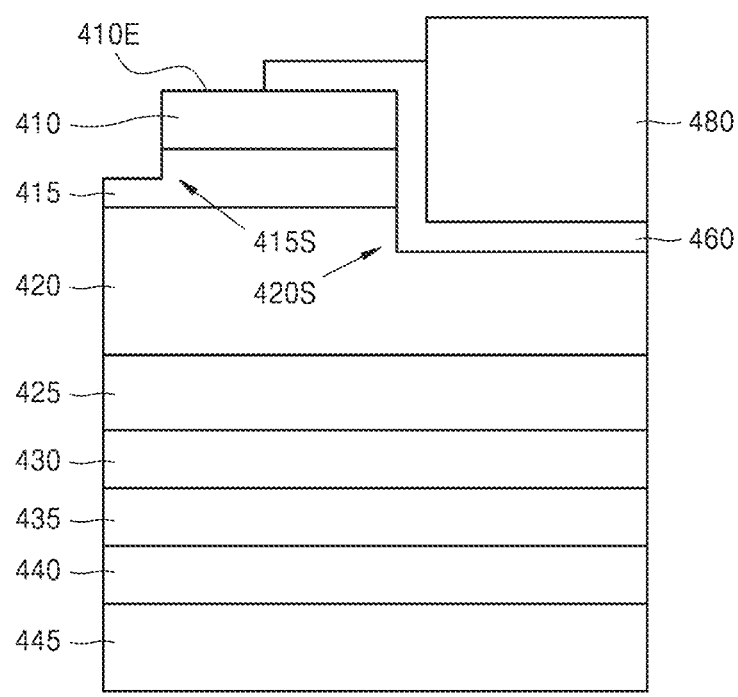

Next, as shown in FIG. 19, the insulating layer 460 is formed on a thin portion, that is, a right side of the step difference 420S of the fourth material layer 420. The insulating layer 460 covers an entire side surface of the step difference 420S. Furthermore, the insulating layer 460 may cover an upper surface of the right portion of the step difference 420S and may extend onto an upper surface of the third material layer 410. The insulating layer 460 covers a portion of the upper surface of the third material layer 410. Also, the insulating layer 460 covers side surfaces of the third material layer 410 and the current blocking layer 415. The insulating layer 460 may be used as a gate insulating film. After the insulating layer 460 is formed, a second mask M2 covering the insulating layer 460 is formed. The second mask M2 covers a portion of the third material layer 410 and exposes the other portion thereof. The portion of the third material layer 410 close to the insulating layer 460 is covered with the second mask M2, and the rest of the third material layer 410 including an edge thereof is exposed. After the second mask M2 is formed, the exposed portion of the third material layer 410 around the second mask M2 is etched. As shown in FIG. 20, the etching may be performed so that the exposed portion of the third material layer 410 is removed and the current blocking layer 415 therebelow is exposed. This etching may be performed so that a thickness of the exposed portion of the current blocking layer 415 is reduced to a given thickness. Due to the etching, a step difference 415S appears on an upper surface of the current blocking layer 415. A thickness of the current blocking layer 415 on a left side of the step difference 415S is less than a thickness of the current blocking layer 415 on a right side of the step difference 415S. The step difference 415S may be located closer to a left side than a right side of the current blocking layer 415. Also, due to the etching, the right portion of the step difference 415S of the current blocking layer 415 becomes a protruding portion, and the third material layer 410 exists on an upper surface of the protruding portion of the current blocking layer 415. The third material layer 410 exists only on the upper surface of the protruding portion of the current blocking layer 415 and covers an entire upper surface of the protruding portion. After the etching, the second mask M2 is removed.

Next, as shown in FIG. 20, the third electrode layer 480 is formed on the insulating layer 460 that covers the right portion of the step difference 420S. The third electrode layer 480 covers an entire upper surface of the insulating layer 460 that covers the right portion of the step difference 420S. The third electrode layer 480 covers the entire side surface of the insulating layer 460. The third electrode layer 480 may have a height greater than that of the insulating layer 460, but may not be greater than that of the insulating layer 460.

Figure 21:
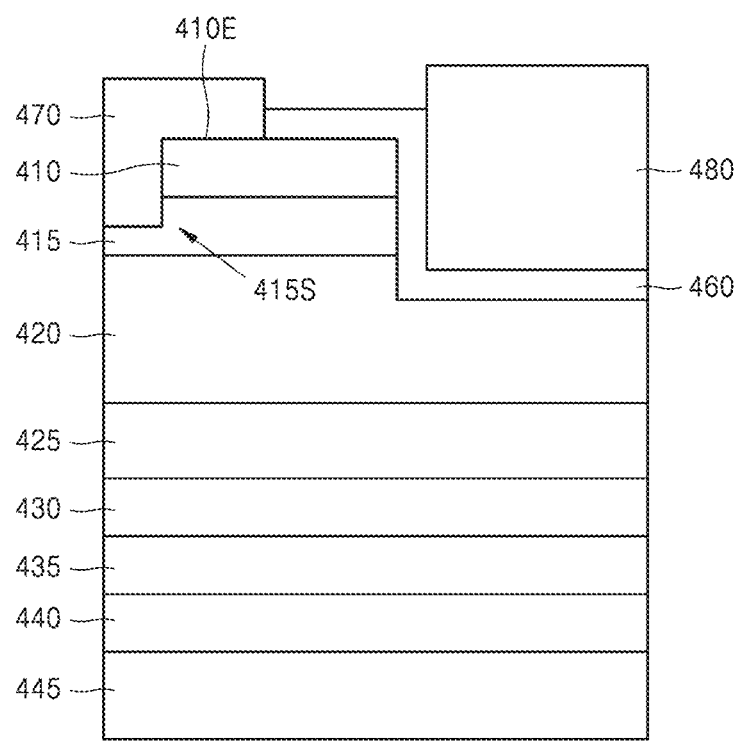

Next, as shown in FIG. 21, the second electrode layer 470 is formed on the third material layer 410. The second electrode layer 470 covers a portion of the third material layer 410 that is not covered by the insulating layer 460. In other words, the exposed portion of the upper surface of the third material layer 410 around the insulating layer 460 is covered with the second electrode layer 470. Restated, the second electrode layer 470 (e.g., a lower electrode layer) may be formed on an exposed surface 410E of the third material layer 410 that is exposed based on the removal of the substrate 900 and the buffer layer 905. The second electrode layer 470 extends along the left side of the third material layer 410 and contacts the step difference 415S of the current blocking layer 415. A left side surface of the third material layer 410 is covered with the second electrode layer 470, and the step difference 415S and an entire upper surface of the left side of the step difference 415S of the current blocking layer 415 are also covered with the second electrode layer 470. Since the current blocking layer 415 is between the extended portion of the second electrode layer 470 and the fourth material layer 420, the second electrode layer 470 and the fourth material layer 420 are not in contact with each other. An upper surface of the second electrode layer 470 may have a height greater than that of the insulating layer 460, but may not be greater. The second electrode layer 470 may be formed to contact the insulating layer 460 on an upper surface of the third material layer 410. The insulating layer 460 is between the third material layer 410 and the third electrode layer 480, which may be a gate electrode. The second electrode layer 470 faces the third electrode layer 480 with the insulating layer 460 therebetween. Since the insulating layer 460 is between the second electrode layer 470 and the third electrode layer 480, the same effect as that appearing when a capacitor exists between the second electrode layer 470 (e.g., a cathode) and the third electrode layer 480 (e.g., a gate electrode) may be obtained.

Figure 22:
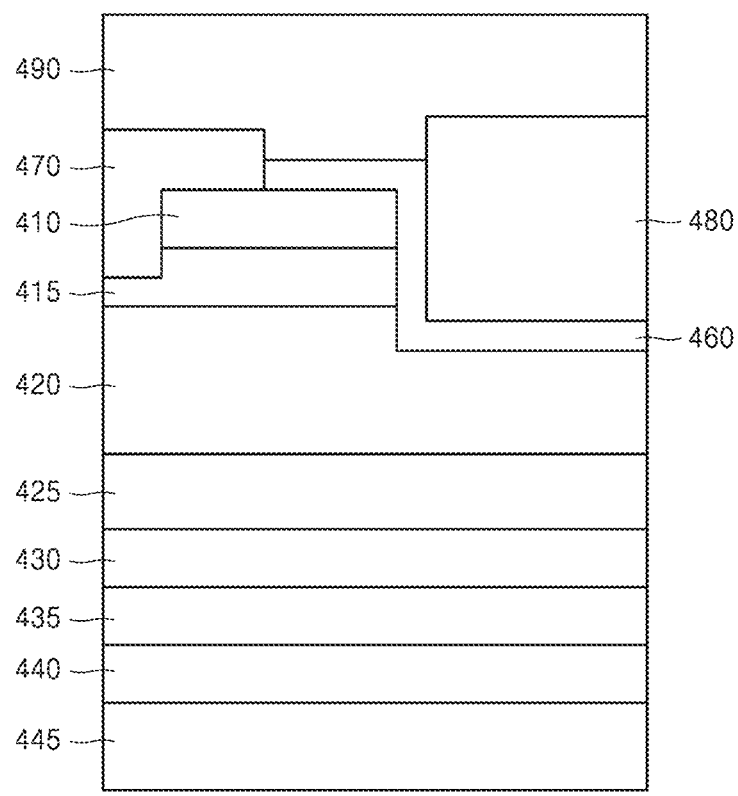

Next, as depicted in FIG. 22, the second and third electrode layers 470 and 480 and the insulating layer 460 may be covered with the lower functional layer 490. The lower functional layer 490 may be a backplane including a substrate and a switching transistor provided on the substrate. In FIG. 22, although the lower functional layer 490 is depicted as being disposed on the second and third electrode layers 470 and 480, an upside down thing of the resultant product of FIG. 22 may be an actual resultant product in that the light-emitting device array is attached to a backplane. When the resultant product of FIG. 22 is upside down, the upper functional layer 445 is at the top, the lower functional layer 490 is at the bottom, and the lower functional layer 490 is below the second and third electrode layers 470 and 480. In some example embodiments, the forming of the second and third electrode layers 470 and 480 may be collectively referred to as forming a lower electrode layer (e.g., when the first electrode layer 440 is referred to as an upper electrode layer). In some example embodiments, the forming of the second and third electrode layers 470 and 480 (e.g., the forming of the lower electrode layer) includes forming a gate electrode (e.g., the third electrode layer 480) and a cathode (e.g., the second electrode layer 470) that are isolated from direct contact with each other. (e.g., by the insulating layer 460), where the gate electrode (e.g., the third electrode layer 480) is isolated from direct contact with a material layer (e.g., the fourth material layer 420 and/or third material layer 410) that is between the MQW layer 425 and the gate electrode. As shown in FIGS. 15-22, the current blocking layer 415 may be formed between a lower electrode layer (e.g., the second and/or third electrode layers 470 and/or 480) and the MQW layer 425, although example embodiments are not limited thereto.

Next, a method of manufacturing a light-emitting device, according to some example embodiments, will be described with reference to FIGS. 23, 24, 25, 26, and 27.

Figure 23:
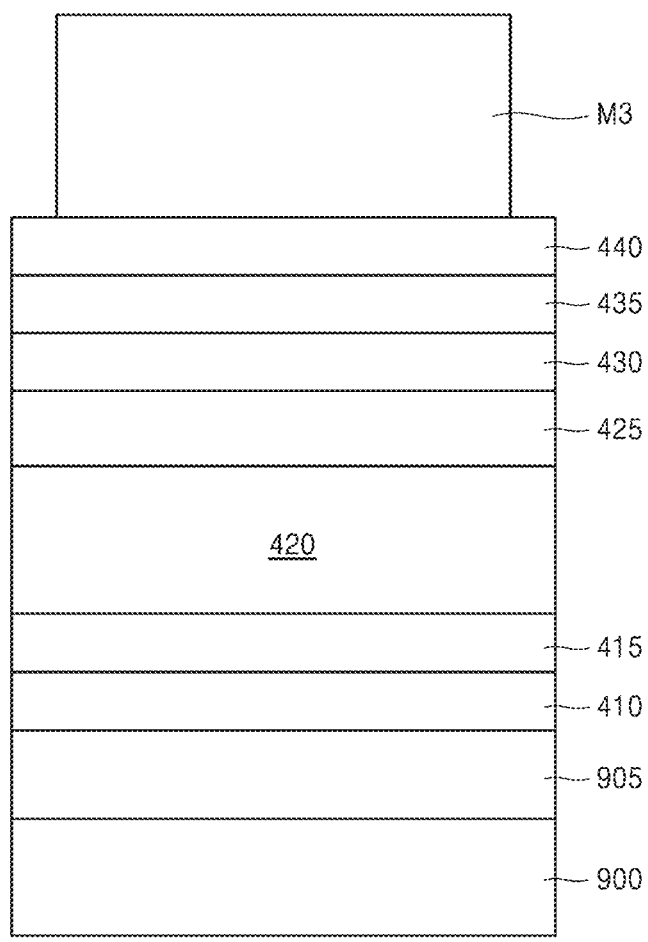
FIGS. 23, 24, 25, 26, and 27 are cross-sectional views illustrating a method of manufacturing a light-emitting device, according to some example embodiments.
Figure 24:
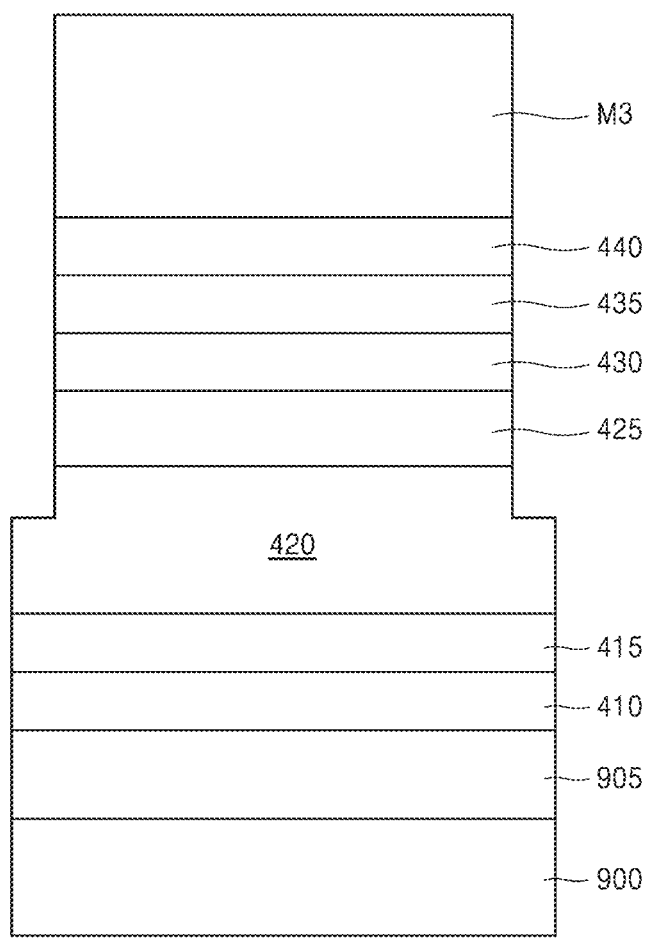

First, the first electrode layer 440 is formed according to the process described with reference to FIGS. 14 and 15. After forming the first electrode layer 440, as shown in FIG. 23, a third mask M3 is formed on the first electrode layer 440. The third mask M3 defines a portion of the first electrode layer 440 and exposes the remaining portion of the first electrode layer 440. Both edge regions of the first electrode layer 440 may be exposed. After forming the third mask M3, the exposed portion of the first electrode layer 440 around the third mask M3 is etched. As shown in FIG. 24, the etching may be performed until the second material layer 435, the first material layer 430 and the MQW layer 425 under the exposed portion of the first electrode layer 440 are sequentially etched and the fourth material layer 420 is exposed. As a result of the etching, portions of the first electrode layer 440, the second material layer 435, the first material layer 430, and the MQW layer 425 around the third mask M3 are removed, and also, a portion of the fourth material layer 420 may be removed. The etching may be performed until a portion of a thickness of the fourth material layer 420 around the third mask M3 is removed. Accordingly, a step difference may be formed on both side surfaces of the fourth material layer 420. After the etching, the third mask M3 is removed.

Figure 25:
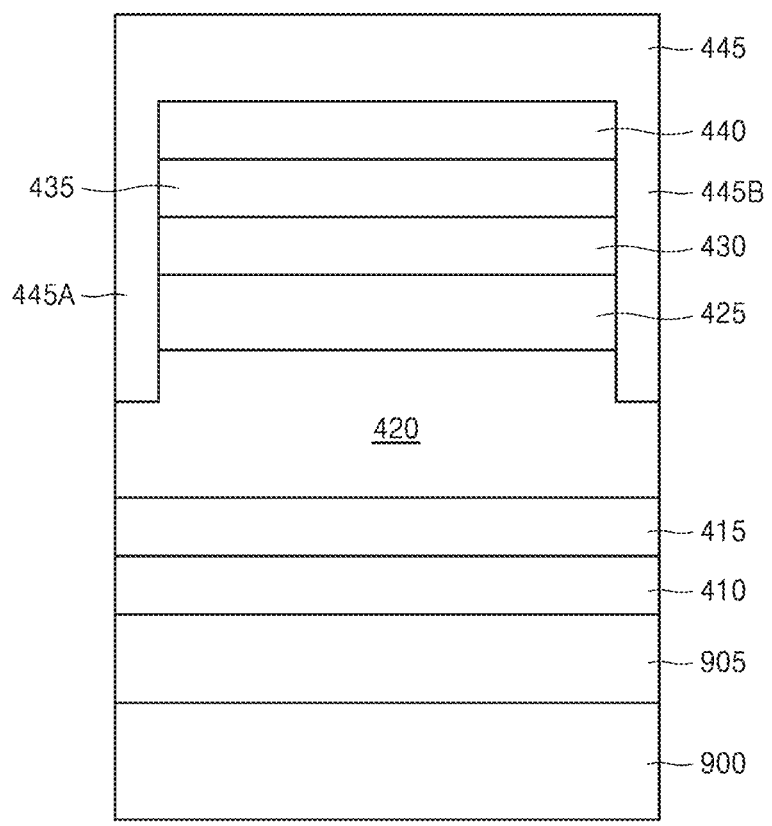

Next, as shown in FIG. 25, an upper functional layer 445 is formed on the first electrode layer 440. The upper functional layer 445 may cover an entire upper surface of the first electrode layer 440 and may cover the side surfaces of the material layers, that is, the fourth material layer 420, the MQW layer 425, the first material layer 430, the second material layer 435, and the first electrode layer 440, exposed by the etching. The upper functional layer 445 may be formed to cover an upper surface of the step difference of the fourth material layer 420. After the upper functional layer 445 is formed, the substrate 900 and the buffer layer 905 are removed. The substrate 900 and the buffer layer 905 may be removed by using a laser method or a polishing method according to the type of the substrate 900.

Figure 26:
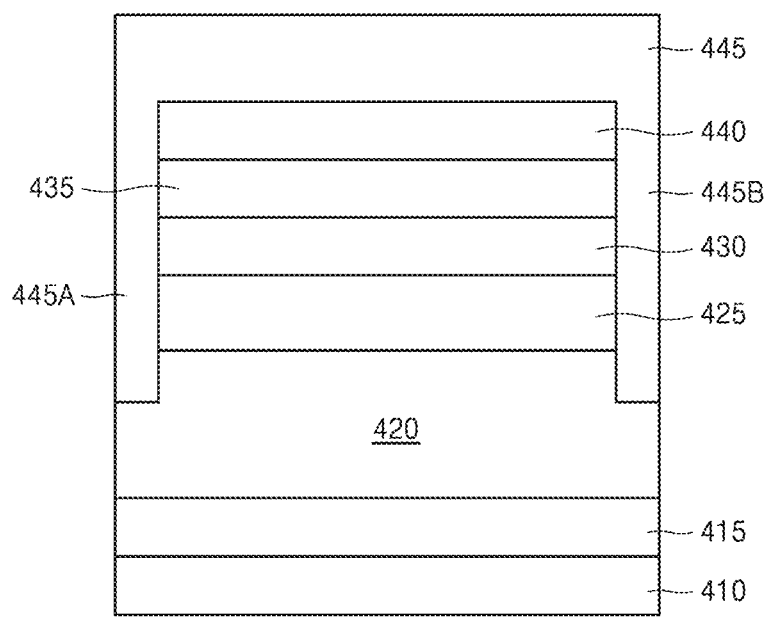

FIG. 26 shows a resultant product after removing the substrate 900 and the buffer layer 905.

Figure 27:
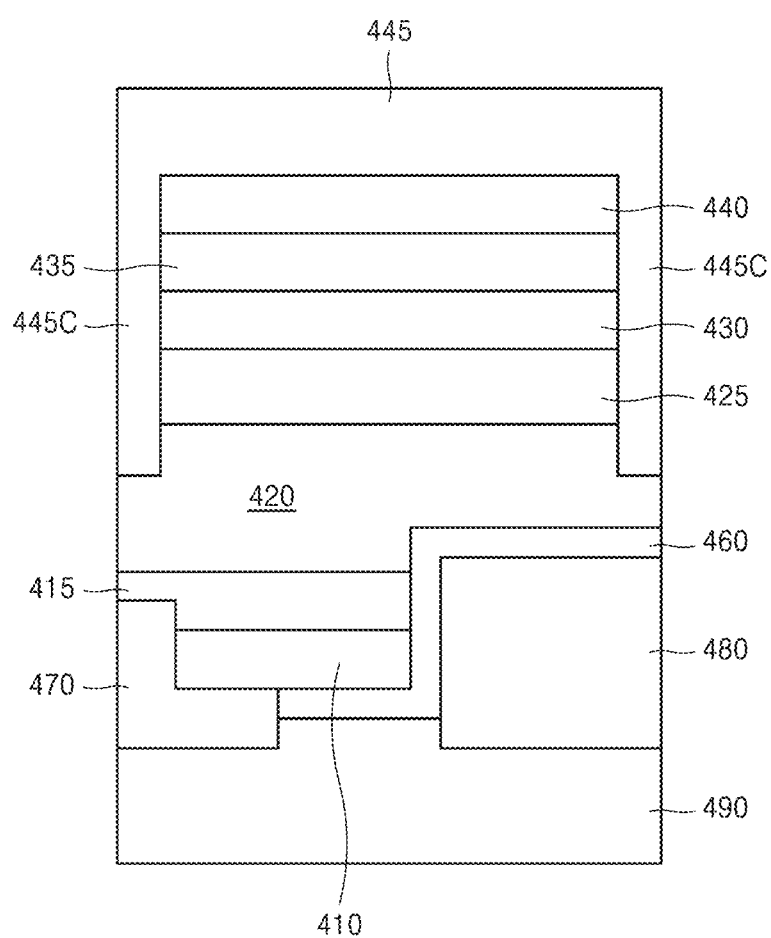

Next, as shown in FIG. 27, after forming the second electrode layer 470, the insulating layer 460, and the third electrode layer 480 under the fourth material layer 420, the lower functional layer 490 covering the second electrode layer 470, the insulating layer 460, and the third electrode layer 480 is formed. A process of forming the material layers 470, 460, 480, and 490 under the fourth material layer 420 may be a process of forming the material layers 470, 460, 480, and 490 on the fourth material layer 420 after reversing up and down the resultant product of FIG. 26. Accordingly, the process of forming the material layers 470, 460, 480, and 490 under the fourth material layer 420 may follow the process described with reference to FIGS. 18 through 22.

Next, a method of manufacturing a light-emitting device, according to some example embodiments, will be described with reference to FIGS. 28, 29, 30, 31, 32, 33, 34, 35, 36, and 37.

Figure 28:
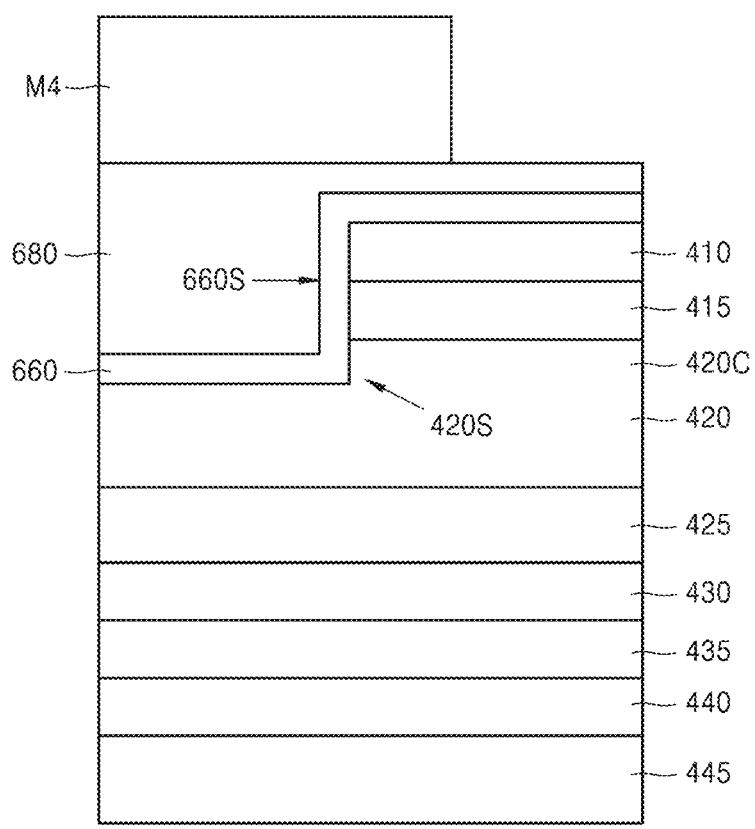
FIGS. 28, 29, 30, 31, 32, 33, 34, 35, 36, and 37 are cross-sectional views illustrating a method of manufacturing a light-emitting device, according to some example embodiments.

First, referring to FIG. 28, processes of forming the first electrode layer 440 and forming the upper functional layer 445 thereon may perform according to the method of manufacturing the light-emitting device described above. After forming the upper functional layer 445, the resultant product is reversed up and down. Accordingly, the upper functional layer 445 becomes the bottom layer, and the third material layer 410 becomes the top layer. In this state, as described with reference to FIG. 18, portions of the third material layer 410, the current blocking layer 415, and the fourth material layer 420 are etched. By the etching, a step difference 420S is formed in the fourth material layer 420. As the step difference 420S is formed, a right portion of the step difference 420S protrudes upward. After the etching, the third material layer 410 and the current blocking layer 415 exist only on a protruding portion 420C of the fourth material layer 420. After the etching, a first insulating layer 660 covering exposed portions by the etching is formed on the third material layer 410. That is, the first insulating layer 660 is formed to cover left sides of the third material layer 410 and the current blocking layer 415. Also, the first insulating layer 660 may be formed to cover the side surface of the portion having the step difference 420S of the fourth material layer 420 and an upper surface of a left side of the step difference 420S. The material of the first insulating layer 660 may be the same as the material of the insulating layer 460 of FIG. 1, but may be different. A third electrode layer 680 is formed on the first insulating layer 660. The material of the third electrode layer 680 may be the same as the material of the third electrode layer 480 of FIG. 1. The third electrode layer 680 covers an entire upper surface of the first insulating layer 660 and an entire side surface 660S between upper surfaces of the first insulating layer 660. An upper surface of the third electrode layer 680 is flat. A fourth mask M4 defining a portion of an upper surface of the third electrode layer 680 is formed on the flat upper surface of the third electrode layer 680. A portion of the third electrode layer 680 covering the step difference 420S and the left portion of the step difference 420S of the fourth material layer 420 is covered by the fourth mask M4. The fourth mask M4 also covers a portion of the third electrode layer 680 on a right side of the step difference 420S of the fourth material layer 420. A right end of the fourth mask M4 is between the step difference 420S and the right side of the fourth material layer 420. The right end of the fourth mask M4 is separated from the right end (right side) of the third electrode layer 680. Accordingly, an upper surface of the third electrode layer 680 between the right end of the fourth mask M4 and the right end of the third electrode layer 680 is exposed.

Figure 29:
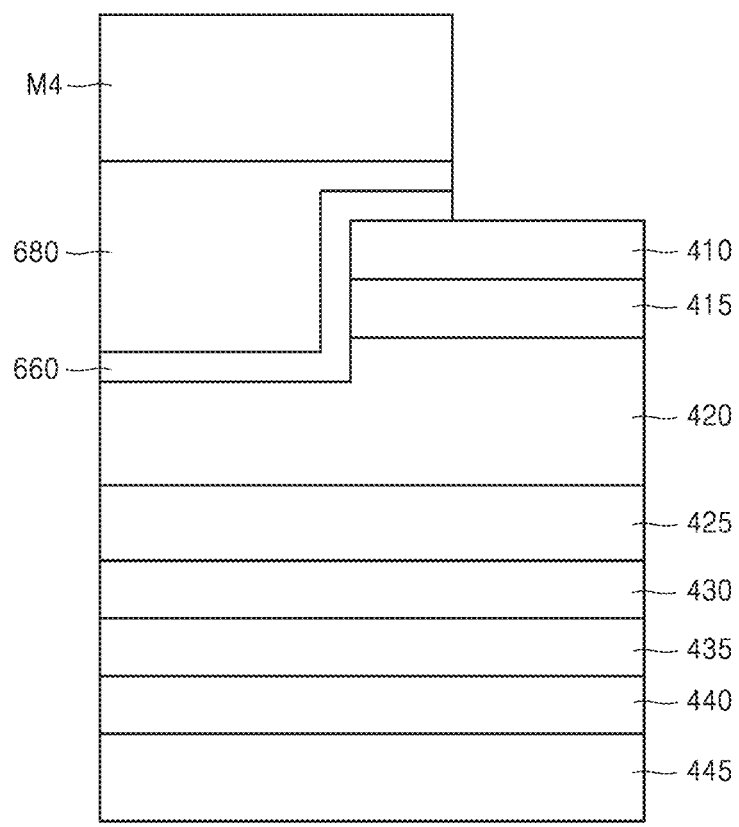

After forming the fourth mask M4, the exposed portion of the third electrode layer 680 and the first insulating layer 660 thereunder are etched as shown in FIG. 29. This etching may be performed so that the third material layer 410 is exposed. After etching, the fourth mask M4 is removed.

Figure 30:
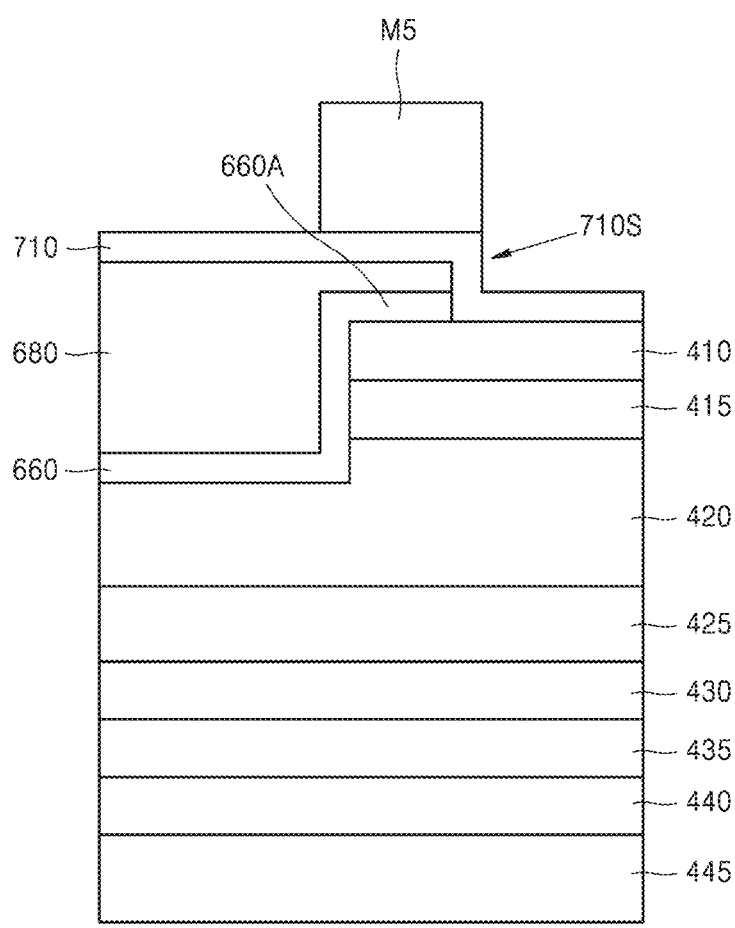

Next, referring to FIG. 30, after the etching, a second insulating layer 710 is formed on an exposed upper surface of the third material layer 410 and the third electrode layer 680. The second insulating layer 710 covers an entire exposed upper surface of the third material layer 410 and an entire upper surface of the third electrode layer 680. Also, the second insulating layer 710 also covers right side surfaces of the first insulating layer 660 and the third electrode layer 680 exposed after the etching. The second insulating layer 710 is in direct contact with the first insulating layer 660 through the right side surface of the first insulating layer 660. The material of the second insulating layer 710 may be the same as the material of the first insulating layer 660. After forming the second insulating layer 710, a fifth mask M5 is formed on the second insulating layer 710. The fifth mask M5 may be formed on a portion of the second insulating layer 710 corresponding to a portion of the third electrode layer 680 formed on an upper surface of the third material layer 410. The fifth mask M5 may cover a portion of an upper surface of the second insulating layer 710. The portion of the second insulating layer 710 covers right side surfaces of the first insulating layer 660 and the third electrode layer 680 that are located on the third material layer 410. In other words, the first insulating layer 660 and the third electrode layer 680 form a step difference on the upper surface of the third material layer 410, and, due to the step difference, a corresponding step difference 710S is also formed in the second insulating layer 710. The fifth mask M5 is formed on the upper surface of the second insulating layer 710 that is on a left side of the step difference 710S and may be formed to cover the portion of the upper surface of the second insulating layer 710 from the step difference 710S in the left direction. A left end of the fifth mask M5 is separated from a left end of the second insulating layer 710. The left end of the fifth mask M5 may correspond to a left end of the extended portion 660A of the first insulating layer 660 on the third material layer 410.

Figure 31:
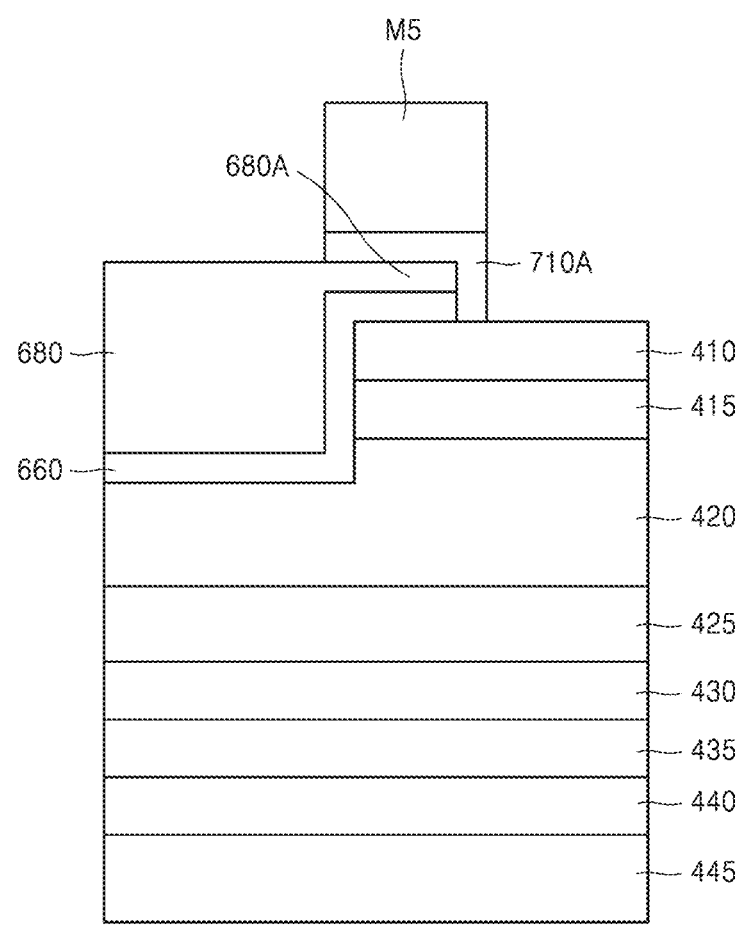
Figure 32:
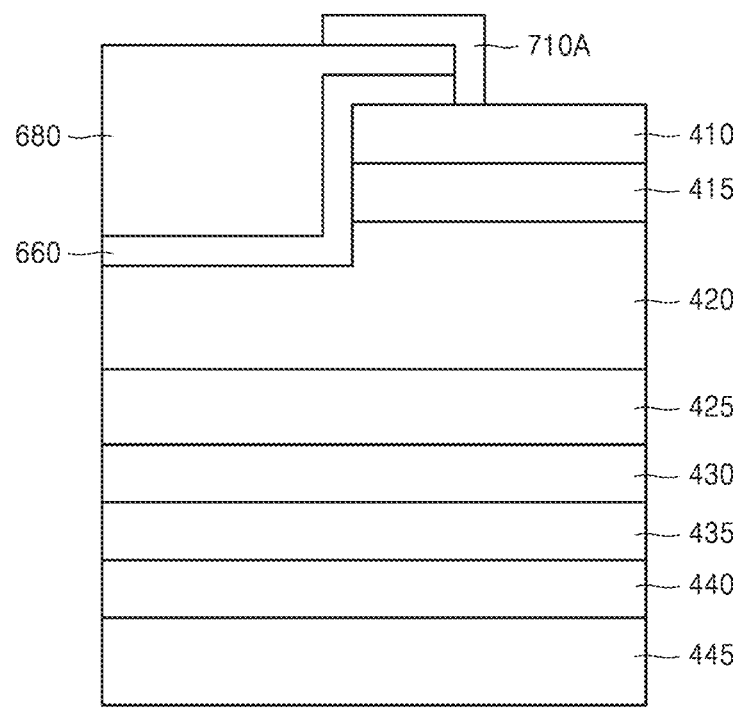

After forming the fifth mask M5, the second insulating layer 710 around the fifth mask M5 is etched. This etching may be performed so that the third electrode layer 680 and the third material layer 410 are exposed. As a result of the etching, as shown in FIG. 31, a second insulating layer pattern 710A that is directly connected to the first insulating layer 660 and covers a side surface and an upper surface of an extended portion 680A of the third electrode layer 680 formed on the upper surface of the third material layer 410 is formed. After the etching, the fifth mask M5 is removed. FIG. 32 shows a result of removing the fifth mask M5.

Figure 33:
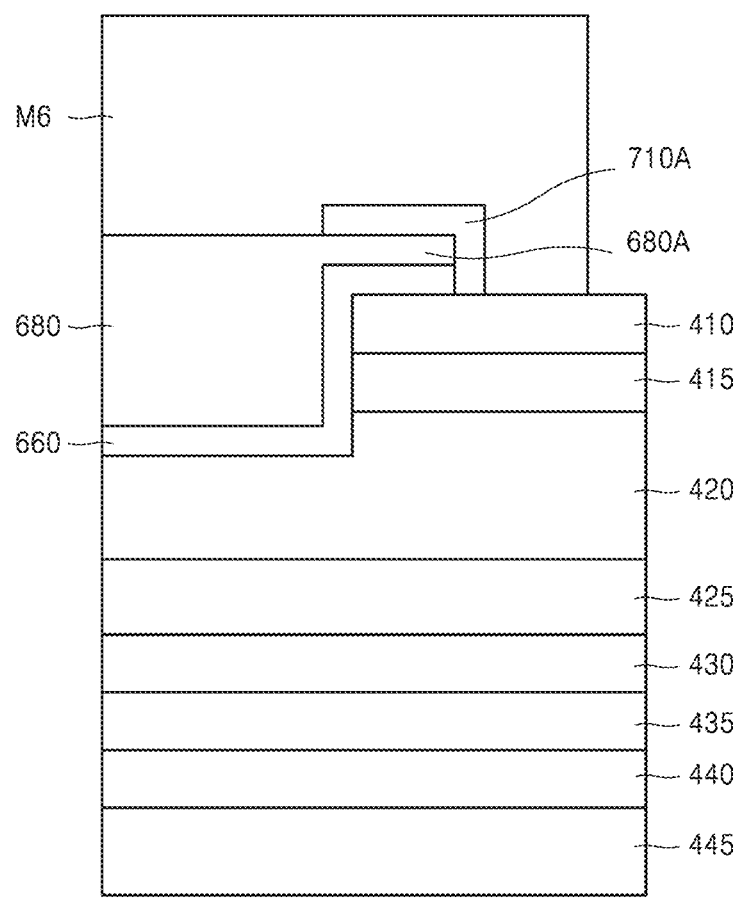

Next, as illustrated in FIG. 33, a sixth mask M6 entirely covering the third electrode layer 680 and the second insulating layer pattern 710A is formed on the third material layer 410. On the upper surface of the third material layer 410, the sixth mask M6 covers a portion and exposes the rest of the upper surface of the third material layer 410. A right end of the sixth mask M6 is separated from the right side of the third material layer 410. Therefore, the upper surface of the third material layer 410 between the sixth mask M6 and the right surface of the third material layer 410 is exposed. After forming the sixth mask M6, the exposed portion of the third material layer 410 is etched around the sixth mask M6. This etching may be performed so that the current blocking layer 415 is exposed. In another example, the etching may be performed so that an exposed portion of the current blocking layer 415 is partially etched after the current blocking layer 415 is exposed. After etching, the exposed portion of the current blocking layer 415 has a thickness less than that of an unexposed portion.

Figure 34:
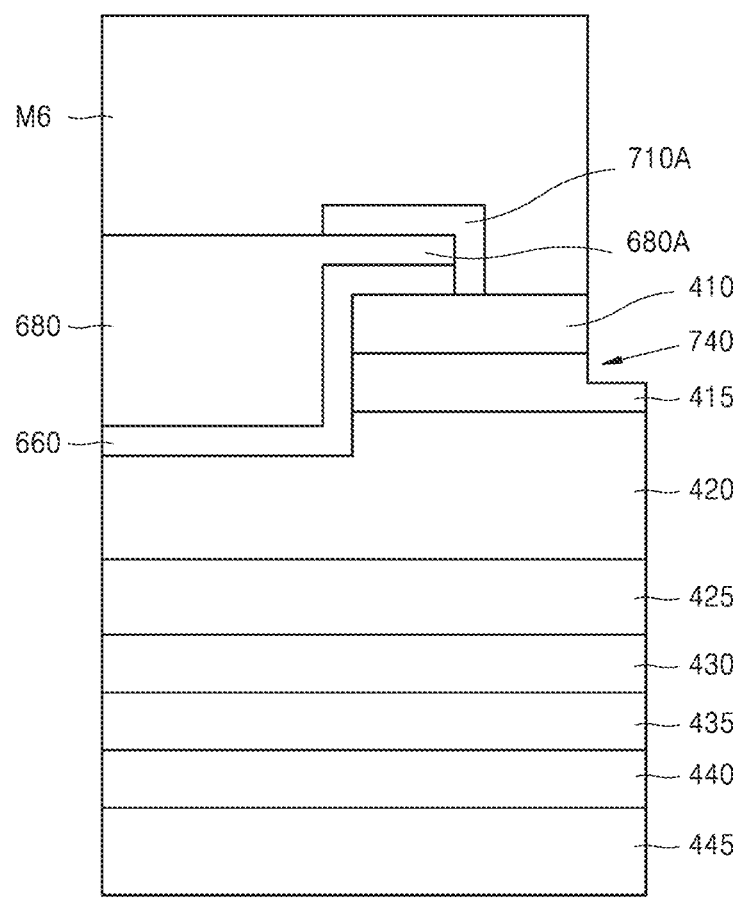
Figure 35:
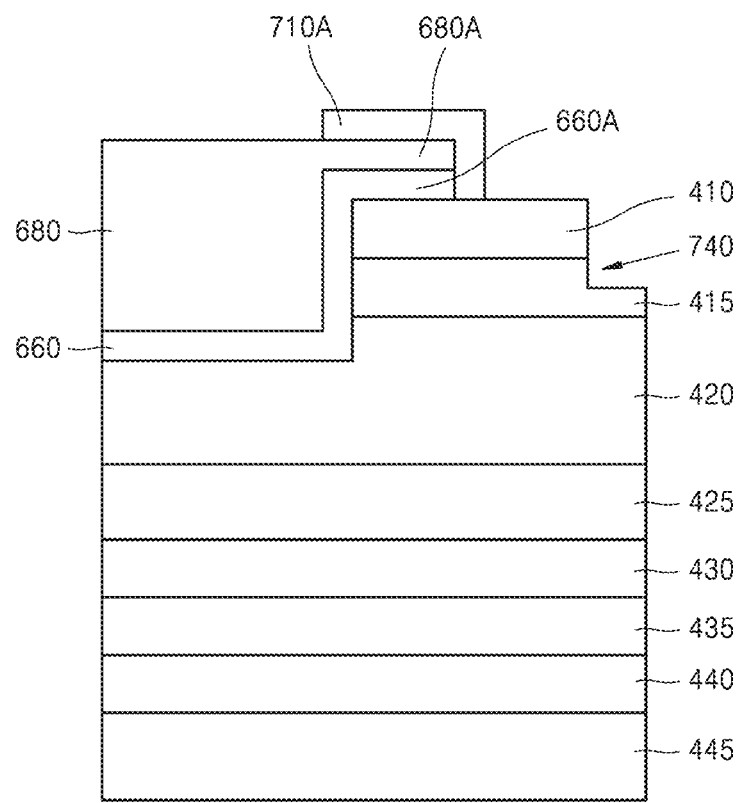

As a result of the etching, as shown in FIG. 34, the exposed portion of the third material layer 410 around the sixth mask M6 is removed, and the portion of the current blocking layer 415 exposed to the etching has a thickness less than that of a portion that is not exposed to the etching. A step difference 740 is formed in the current blocking layer 415 by the etching. A left side of the current blocking layer 415 has a thickness greater than that of a right side based on the step difference 740. After the etching, the sixth mask M6 is removed. FIG. 35 shows a resultant product of removing the sixth mask M6.

Referring to FIG. 35, the extended portion 660A of the first insulating layer 660, the second extended portion 680A of the third electrode layer 680, and the second insulating layer pattern 710A are sequentially formed on the upper surface of the third material layer 410.

Figure 36:
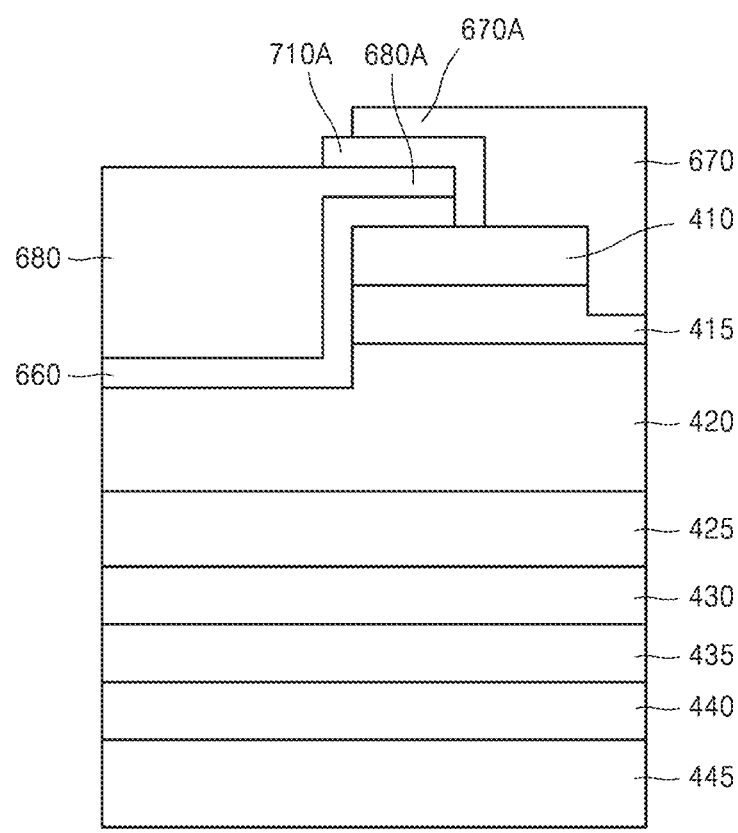

Referring to FIG. 36, the second electrode layer 670 having a first extended portion 670A that is in contact with the current blocking layer 415 and extends onto the second insulating layer pattern 710A is formed on the third material layer 410. The second electrode layer 670 covers an entire upper surface of the third material layer 410. A portion of the second electrode layer 670 extends downwards along the right side of the third material layer 410. The entire right side of the third material layer 410 is covered with the second electrode layer 670. Also, the entire side and upper surfaces of the portion where the step difference 740 of the current blocking layer 415 is formed are also covered by the second electrode layer 670. The second electrode layer 670 also covers an entire right side surface of the second insulating layer pattern 710A. The first extended portion 670A of the second electrode layer 670 is formed only on a portion of the upper surface of the second insulating layer pattern 710A. A left end of the first extended portion 670A of the second electrode layer 670 is separated from a left end of the second insulating layer pattern 710A. In this way, since the second electrode layer 670 is formed, the second extended portion 680A of the third electrode layer 680, the second insulating layer pattern 710A, and the first extended portion 670A of the second electrode layer 670 are sequentially stacked on the upper surface of the third material layer 410. The second extended portion 680A of the third electrode layer 680 (e.g., gate electrode), the second insulating layer pattern 710A, and the first extended portion 670A of the second electrode layer 670 (e.g., cathode) that are sequentially stacked in this way may form a capacitor.

As a result, since the second electrode layer 670 is formed, a capacitor between the second electrode layer 670 (e.g., cathode) and the third electrode layer 680 (e.g., gate electrode) may also be formed. The third electrode layer 680 is used as a gate electrode to control a current flowing between the first electrode layer 440 and the second electrode layer 670, and thus, the formation of the third electrode layer 680 may denote the formation of a driving device, that is, a driving transistor for driving a light-emitting device. The capacitor is provided in the light-emitting device together with the third electrode layer 680 that performs as a driving transistor. The capacitor performs as a storage capacitor, and thus, after a switching device is turned-on during operation of the light-emitting device, the capacitor is first charged. Accordingly, a voltage is applied to the third electrode layer 680 used as a gate electrode, a channel is formed, and a current flows through the light-emitting device.

Figure 37:
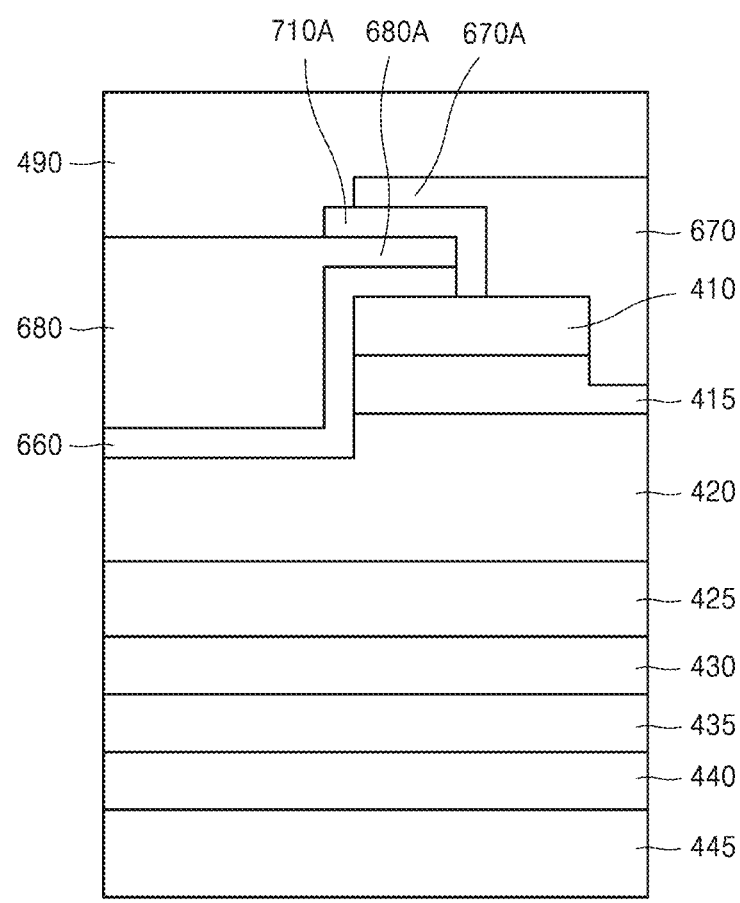

Since the second electrode layer 670 is formed, the manufacture of a light-emitting device including a driving device is substantially completed. After the second electrode layer 670 is formed, as depicted in FIG. 37, the functional layer 490 may be formed on the second and third electrode layers 670 and 680. The functional layer 490 may be provided to cover the entire upper surface of the second and third electrode layers 670 and 680. The functional layer 490 may be electrically connected to the second and third electrode layers 670 and 680. The functional layer 490 may include a plurality of devices for driving a pixel, and one of the plurality of devices, for example, a switching transistor, may be electrically connected to the third electrode layer 680.

Next, a method of manufacturing a light-emitting device, according to some example embodiments, will be described with reference to FIGS. 38, 39, 40, and 41. In the manufacturing method described above, if the upper functional layer 445 connected to the first electrode layer 440 that is used as an anode is formed earlier than the functional layer 490 connected to the second and third electrode layers 470 and 480 (or 670 and 680), the manufacturing method illustrated in FIGS. 38 through 41 shows a process of forming a light-emitting device in a reverse direction.

Figure 38:
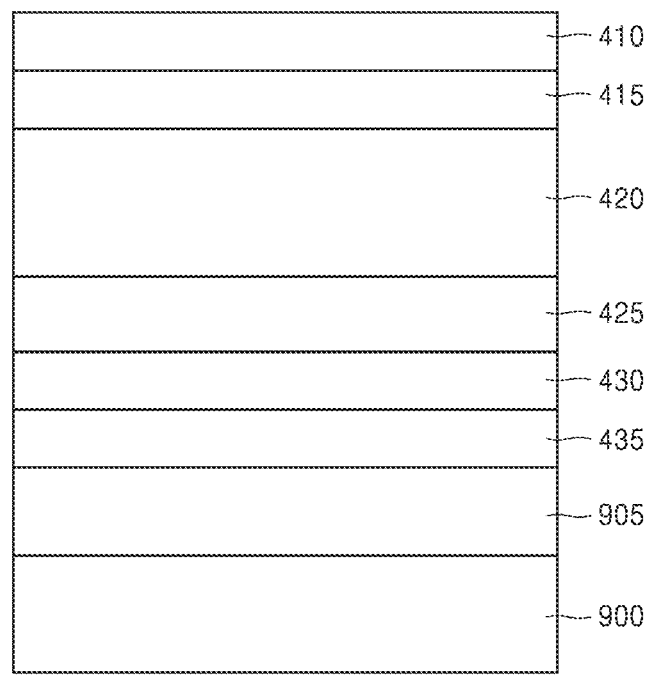
FIGS. 38, 39, 40, and 41 are cross-sectional views illustrating a method of manufacturing a light-emitting device, according to some example embodiments.

First, referring to FIG. 38, a buffer layer 905 is formed on a substrate 900. P-type material layers, that is, the second material layer 435 and the first material layer 430 (e.g., a p+-type material layer and a p-type material layer) are sequentially formed on the buffer layer 905. Next, an MQW layer 425 is formed on the first material layer 430, and n-type material layers, that is, the fourth material layer 420 and the third material layer 410 (e.g., a n-type material layer and a n+-type material layer) are sequentially formed on the MQW layer 425. In this process, a current blocking layer 415 that is a p-type material layer is formed between the fourth material layer 420 (which may be referred to as a first portion of a second material layer formed on the substrate 900) and the third material layer 410 (which may be referred to as another portion of the second material layer formed on the substrate 900 so as to be between the current blocking layer 415 and an upper electrode layer (e.g., the second and third electrode layers 470 and 480)). As a method of forming the material layers, for example, an epitaxial growth method may be used.

Figure 39:
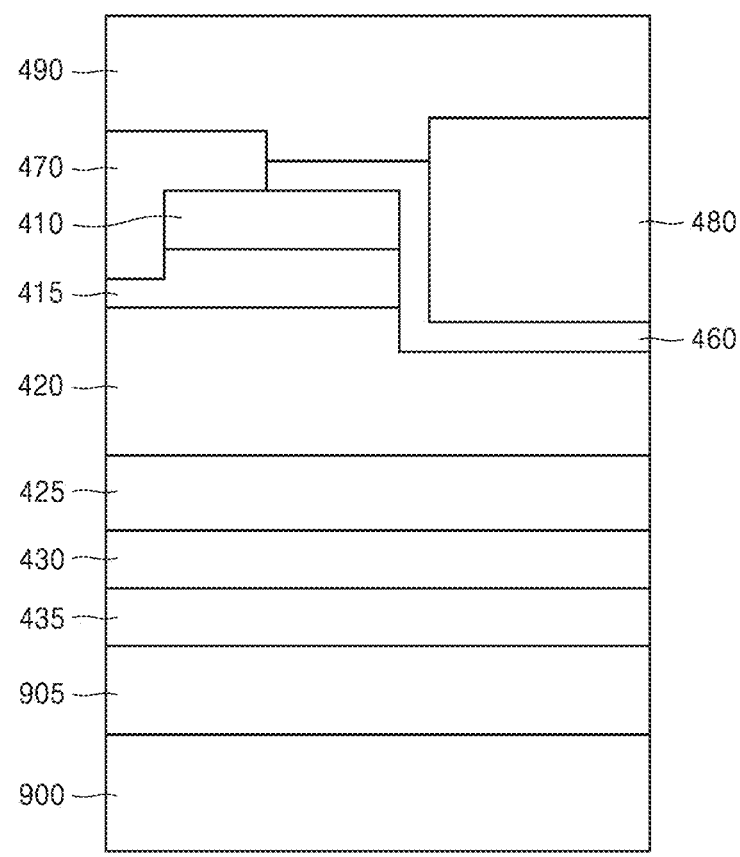

Next, as shown in FIG. 39, after the fourth material layer 420, the current blocking layer 415, and the third material layer 410 are patterned, the insulating layer 460 and the second and third electrode layers 470 and 480 are formed, and then, a functional layer 490 covering the second and third electrode layers 470 and 480 and the insulating layer 460 is formed. The forming process may follow the process described with reference to FIGS. 18 through 22.

Figure 40:
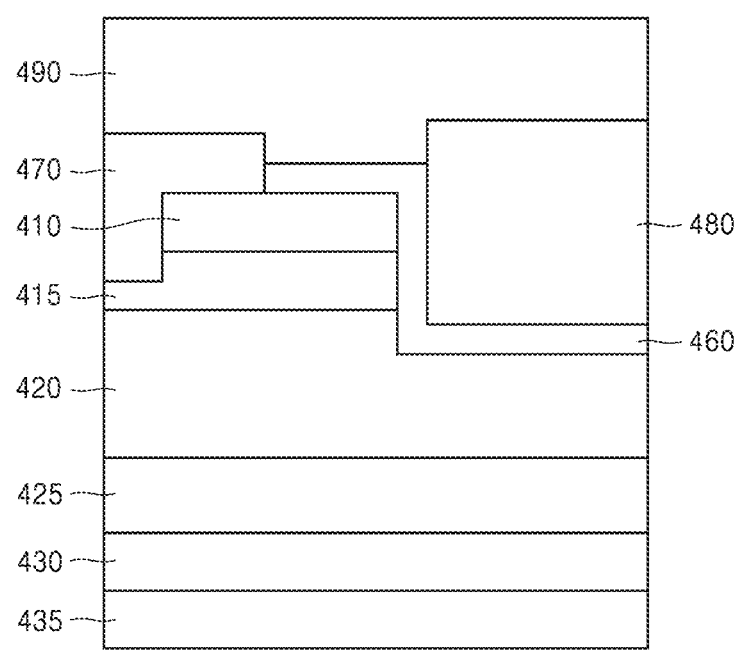
Figure 41:
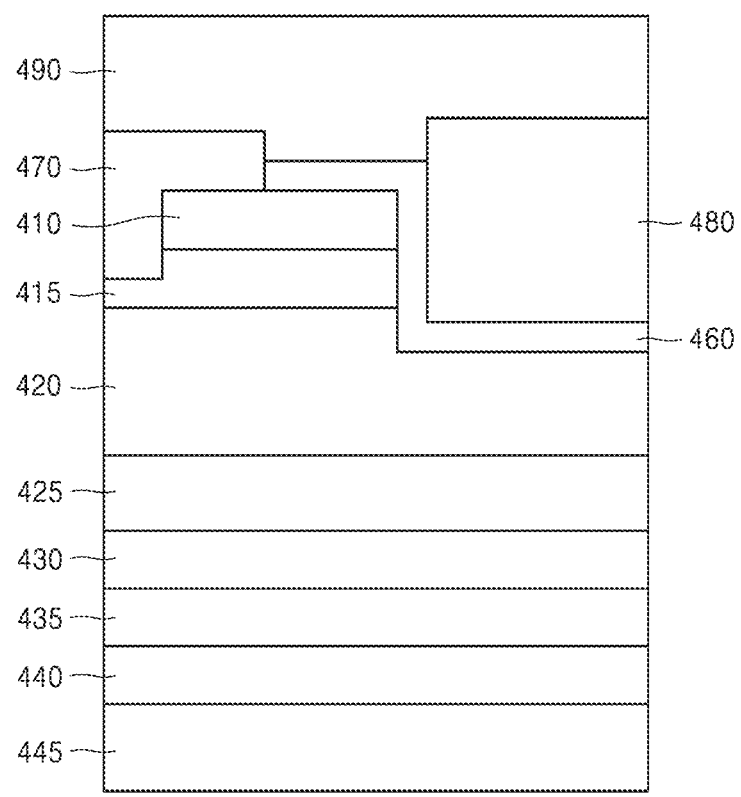

After the functional layer 490 is formed, as shown in FIG. 40, the substrate 900 and the buffer layer 905 are removed from the resultant product of FIG. 39. Next, as depicted in FIG. 41, a first electrode layer 440 that is used as an anode is formed on a lower surface of the second material layer 435. An upper functional layer 445 is formed on a lower surface of the first electrode layer 440. The process of forming the first electrode layer 440 on the lower surface of the second material layer 435 may denote a process of forming the first electrode layer 440 on an upper surface of the second material layer 435, which is a top layer after reversing the resultant product of FIG. 40 so that the second material layer 435 is the top layer. As shown in FIGS. 38-41, the second and third electrode layers 470 and 480 may be considered to be an upper electrode layer, which may include a gate electrode (e.g., third electrode layer 480) and a cathode (e.g., second electrode layer 470) and the first electrode layer 440 may be considered to be a lower electrode layer. As shown in FIGS. 38-41, the current blocking layer 415 may be formed between an upper lower electrode layer (e.g., the second and third electrode layers 470 and 480) and the MQW layer 425, although example embodiments are not limited thereto.

As described above, the functional layer 490 formed on the second and third electrode layers 470 and 480 is formed ahead of the upper functional layer 445 formed on the first electrode layer 440, and thus, a thermal history received by elements, for example, phosphors or quantum dots included in the upper functional layer 445 when the upper functional layer 445 is formed before the functional layer 490 is formed may be reduced and process stability may be improved.

A pixel of a display may include a light-emitting device, a driving and switching transistor, and a capacitor, and a light-emitting device according to some example embodiments may include a driving transistor capable of controlling a carrier (for example, current) supplied to an MQW layer. A light-emitting device according to some example embodiments may also include a capacitor therein. Accordingly, when a light-emitting device according to the disclosure is used, brightness of the light-emitting device may be controlled, an integration degree of the light-emitting device array may be increased, and an integration degree of a pixel may also be increased.

Also, since a driving transistor or a driving transistor and a capacitor that are disposed on a backplane under a light-emitting device are included in the light-emitting device, a switching transistor included in the backplane may be provided outside the backplane, thereby simplifying a circuit configuration of the backplane.

It should be understood that some example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A light-emitting device, comprising:
   a first electrode layer;
   a second electrode layer;
   a third electrode layer isolated from direct contact with the first and second electrode layers;
   a multi-quantum well (MQW) layer between the first electrode layer and the second and third electrode layers;
   a first material layer between the first electrode layer and the MQW layer, the first material layer doped with a first conductive type dopant;
   a second material layer between the second and third electrode layers and the MQW layer, the second material layer doped with a second conductive type dopant;
   a gate insulating layer between the third electrode layer and the second material layer; and
   a current blocking layer configured to at least partially block a flow of a current between the second electrode layer and the MQW layer.

2. The light-emitting device of claim 1, further comprising:
   a capacitor between the second electrode layer and the third electrode layer.

3. The light-emitting device of claim 1, wherein the first material layer includes a sequential stack of a p-type material layer and a p+-type material layer.

4. The light-emitting device of claim 1, wherein the second material layer includes a sequential stack of an n-type material layer and an n+-type material layer.

5. The light-emitting device of claim 1, wherein the current blocking layer includes an oxide layer.

6. The light-emitting device of claim 1, wherein the current blocking layer includes a nitride layer.

7. The light-emitting device of claim 1, wherein the first and second material layers include compound semiconductor layers.

8. The light-emitting device of claim 2, wherein the capacitor includes
   a portion of the second electrode layer,
   a portion of the third electrode layer, and
   a portion of the gate insulating layer.

9. The light-emitting device of claim 4, wherein the current blocking layer is between the n-type material layer and the n+-type material layer.

10. The light-emitting device of claim 8, wherein the portion of the second electrode layer, the portion of the gate insulating layer, and the portion of the third electrode layer are sequentially stacked.

11. The light-emitting device of claim 9, wherein a side surface of the third electrode layer faces side surfaces of the n+-type material layer and the current blocking layer, and the gate insulating layer is between the side surface of the third electrode layer and the side surfaces of the n+-type material layer and the current blocking layer.

12. The light-emitting device of claim 9, wherein the second electrode layer covers a side surface of the n+-type material layer and a plane adjacent to the side surface of the n+-type material layer.

13. The light-emitting device of claim 1, wherein the first electrode layer is connected to a functional layer.

14. The light-emitting device of claim 1, wherein the third electrode layer is connected to a functional layer that includes a switching transistor.

15. The light-emitting device of claim 14, wherein
   the third electrode layer includes a gate electrode of a driving transistor, and
   a capacitor is connected between the gate electrode of the driving transistor and a ground terminal.

16. The light-emitting device of claim 13, wherein the functional layer includes one of a fluorescent layer, a quantum dot layer, or a color filter.

17. A light-emitting device, comprising:
   a first electrode;
   a second electrode;
   a multi-quantum well (MQW) layer between the first and second electrodes;
   a p-type material layer between the first electrode and the MQW layer;
   an n-type material layer between the second electrode and the MQW layer;
   a blocking layer configured to at least partially block a flow of a carrier to the MQW layer; and
   a third electrode configured to form a channel through which the carrier flows in the blocking layer in response to an operating voltage being applied to the light-emitting device.

18. The light-emitting device of claim 17, further comprising:
   a capacitor between the second electrode and the third electrode.

19. The light-emitting device of claim 17, further comprising:
   an insulating layer between the third electrode, the blocking layer, and the n-type material layer.

20. The light-emitting device of claim 17, wherein the first electrode is connected to a functional layer.

21. The light-emitting device of claim 17, wherein the third electrode is connected to a functional layer that includes a switching transistor.

22. The light-emitting device of claim 18, wherein the capacitor includes a portion of the second electrode, a portion of the third electrode, and a portion of an insulating layer.

23. The light-emitting device of claim 22, wherein the portion of the second electrode, the portion of the insulating layer, and the portion of the third electrode are sequentially stacked.

24. The light-emitting device of claim 18, wherein
the third electrode includes a gate electrode of a driving transistor, and
the capacitor is connected between the gate electrode of the driving transistor and a ground terminal.

25. A display device comprising:
a first panel comprising at least a transistor;
a light emitting device provided on the first panel; and
a second panel parallel to the first panel and covering the light emitting device,
wherein the light emitting device is the light emitting device of claim 1.

26. The display device of claim 25, wherein layers comprised in the light-emitting device are sequentially stacked on the first panel toward the second panel.

27. The display device of claim 25, wherein the first panel, the light-emitting device, and the second panel are arranged so that light emitted from one of a plurality of sides of the multi-quantum well layer is emitted through the second panel.

28. A method of manufacturing a light-emitting device, the method comprising:
forming a buffer layer on a substrate;
sequentially forming, on the buffer layer, a first material layer doped with a first conductive type dopant, a multi-quantum well (MQW) layer, a second material layer doped with a second conductive type dopant, and an upper electrode layer;
removing the substrate and the buffer layer; and
forming a lower electrode layer on an exposed surface of the first material layer exposed based on the removal of the substrate and the buffer layer,
forming a blocking layer that is configured to at least partially block a flow of a carrier to the MQW layer, wherein
one of the forming of the upper electrode layer or the forming of the lower electrode layer includes forming a gate electrode and a cathode isolated from direct contact with each other, and
the gate electrode is formed so as not to contact a material layer formed between the MQW layer and the gate electrode.

29. The method of claim 28, wherein the blocking layer is formed between the upper electrode layer and the MQW layer.

30. The method of claim 28, wherein the blocking layer is formed between the lower electrode layer and the MQW layer.

31. The method of claim 28, wherein
the first conductive type dopant includes a p-type dopant, and the second conductive type dopant includes an n-type dopant, and
the forming of the upper electrode layer includes
forming the gate electrode, and
forming the cathode.

32. The method of claim 28, wherein
the first conductive type dopant includes an n-type dopant, and the second conductive type dopant includes a p-type dopant, and
the forming of the lower electrode layer includes
forming the gate electrode, and
forming the cathode.

33. The method of claim 28, further comprising:
forming an insulating layer between the material layer and the gate electrode.

34. The method of claim 28, wherein the forming of the first material layer includes
sequentially forming an n+-type material layer and an n-type material layer, or
sequentially forming a p+-type material layer and a p-type material layer.

35. The method of claim 28, wherein the forming of the second material layer includes
sequentially forming an n+-type material layer and an n-type material layer, or
sequentially forming a p+-type material layer and a p-type material layer.

36. The method of claim 28, wherein the blocking layer includes a layer configured to block a flow of current to the MQW layer, and the blocking layer is formed as a p-type material layer.

37. The method of claim 28, further comprising:
forming a first functional layer on one of the upper electrode layer or the lower electrode layer, and
forming a second functional layer is formed on another one of the upper electrode layer or the lower electrode layer.

38. The method of claim 29, wherein a portion of the second material layer is formed between the blocking layer and the MQW layer, and another portion of the second material layer is formed between the blocking layer and the upper electrode layer.

39. The method of claim 30, wherein a portion of the first material layer is formed between the blocking layer and the MQW layer, and another portion of the first material layer is formed between the blocking layer and the lower electrode layer.

40. The method of claim 31, wherein an insulating layer is formed between the gate electrode and the second material layer.

41. The method of claim 32, wherein an insulating layer is formed between the gate electrode and the first material layer.

42. The method of claim 33, wherein the gate electrode, the cathode, and the insulating layer are formed so that a capacitor is formed between the gate electrode and the cathode.

43. The method of claim 42, wherein the capacitor is formed based on sequentially stacking a portion of the gate electrode, a portion of the insulating layer, and a portion of the cathode.

* * * * *